(12) United States Patent
Shao et al.

(10) Patent No.: US 12,426,255 B2
(45) Date of Patent: Sep. 23, 2025

(54) SEMICONDUCTOR STRUCTURE, METHOD FOR MANUFACTURING SEMICONDUCTOR STRUCTURE, AND MEMORY

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 528 days.

(21) Appl. No.: 17/949,987

(22) Filed: Sep. 21, 2022

(65) Prior Publication Data

US 2023/0016905 A1    Jan. 19, 2023

Related U.S. Application Data

(63) Continuation of application No. PCT/CN2022/105112, filed on Jul. 12, 2022.

(30) Foreign Application Priority Data

Jun. 21, 2022 (CN) .......................... 202210709198.5

(51) Int. Cl.
*H10B 12/00* (2023.01)

(52) U.S. Cl.
CPC ......... *H10B 12/39* (2023.02); *H10B 12/0385* (2023.02); *H10B 12/0387* (2023.02); *H10B 12/053* (2023.02)

(58) Field of Classification Search
CPC .............. H10B 12/395; H10B 12/0387; H10B 12/0383
See application file for complete search history.

(56) References Cited

U.S. PATENT DOCUMENTS

| 5,571,730 | A | 11/1996 | Park |
|---|---|---|---|
| 2005/0285176 | A1 | 12/2005 | Kim |
| 2008/0035976 | A1 | 2/2008 | Kim |

(Continued)

FOREIGN PATENT DOCUMENTS

| CN | 1767199 A | 5/2006 |
|---|---|---|
| CN | 101874303 A | 10/2010 |

(Continued)

*Primary Examiner* — Edward Chin
(74) *Attorney, Agent, or Firm* — Syncoda LLC; Feng Ma

(57) ABSTRACT

A semiconductor structure, a method for manufacturing a semiconductor structure, and a memory are provided. The semiconductor structure includes: a plurality of first semiconductor pillars, a plurality of second semiconductor pillars, a first support layer, and a storage structure. The plurality of first semiconductor pillars are arranged in an array in a first direction and in a second direction. Each of the first direction and the second direction is perpendicular to an extending direction of each first semiconductor pillar, and the first direction intersects with the second direction. The first support layer covers sidewalls of top portions of the plurality of first semiconductor pillars. Each second semiconductor pillar is arranged on a respective one of the plurality of first semiconductor pillars. The storage structure is arranged around at least sidewalls of the plurality of first semiconductor pillars and sidewalls of the plurality of second semiconductor pillars.

15 Claims, 21 Drawing Sheets

(56) References Cited

U.S. PATENT DOCUMENTS

| | | |
|---|---|---|
| 2010/0295110 A1 | 11/2010 | Takaishi |
| 2011/0244302 A1 | 10/2011 | Wasson |
| 2012/0156844 A1 | 6/2012 | Kim |
| 2013/0148260 A1 | 6/2013 | Wasson |
| 2013/0234240 A1 | 9/2013 | Moon et al. |
| 2014/0035018 A1 | 2/2014 | Lee |
| 2015/0001617 A1 | 1/2015 | Kim et al. |
| 2015/0348976 A1 | 12/2015 | Moon et al. |
| 2018/0308923 A1 | 10/2018 | Wu et al. |
| 2019/0103407 A1 | 4/2019 | Kim et al. |
| 2019/0189617 A1 | 6/2019 | Kim et al. |
| 2019/0206982 A1 | 7/2019 | Wu et al. |
| 2019/0252387 A1 | 8/2019 | Moon et al. |
| 2019/0273081 A1 | 9/2019 | Moon et al. |
| 2020/0111793 A1 | 4/2020 | Kim et al. |
| 2020/0111794 A1* | 4/2020 | Cheng ............... H01L 21/76227 |
| 2020/0243532 A1 | 7/2020 | Kim et al. |
| 2021/0057416 A1 | 2/2021 | Kim et al. |
| 2021/0066306 A1* | 3/2021 | Tang .................... H10B 12/036 |
| 2021/0151440 A1 | 5/2021 | Tang et al. |
| 2021/0202485 A1 | 7/2021 | Inaba |
| 2021/0202490 A1* | 7/2021 | Cho ....................... H10D 1/716 |
| 2022/0052151 A1 | 2/2022 | Wang |
| 2022/0173109 A1 | 6/2022 | Rigano |
| 2022/0246621 A1 | 8/2022 | Cho et al. |
| 2023/0292501 A1* | 9/2023 | Goh .................... H01L 23/5283 |

FOREIGN PATENT DOCUMENTS

| | | | | |
|---|---|---|---|---|
| CN | 103311249 A | | 9/2013 | |
| CN | 108735744 A | | 11/2018 | |
| CN | 109065501 A | | 12/2018 | |
| CN | 109616474 A | | 4/2019 | |
| CN | 113078116 A | | 7/2021 | |
| CN | 113611671 A | | 11/2021 | |
| CN | 113707614 A | | 11/2021 | |
| CN | 114068414 A | | 2/2022 | |
| CN | 114078777 A | | 2/2022 | |
| CN | 114093821 A | | 2/2022 | |
| CN | 114256240 A | * | 3/2022 | ............. H10B 12/30 |
| CN | 114342065 A | | 4/2022 | |
| CN | 114373764 A | | 4/2022 | |
| CN | 114551450 A | | 5/2022 | |
| CN | 114582808 A | | 6/2022 | |
| JP | H0864777 A | | 3/1996 | |
| JP | 2013168570 A | | 8/2013 | |

* cited by examiner

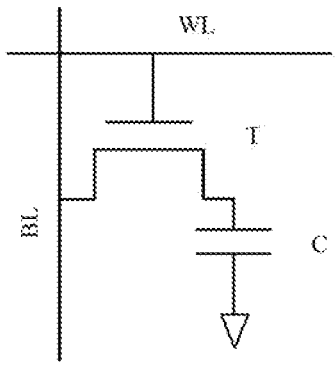

FIG. 1

```
┌─────────────────────────────────────────────────────────────────┐
│ A first semiconductor base is provided, and a first active layer is formed on the first │ ─ S100
│ semiconductor base, in which the first active layer includes a plurality of first semiconductor │
│ pillars arranged in an array in a first direction and in a second direction, each of the first │
│ direction and the second direction is perpendicular to an extending direction of each of the │
│ plurality of first semiconductor pillars, and the first direction intersects with the second │
│ direction │
└─────────────────────────────────────────────────────────────────┘
                                  ↓
┌─────────────────────────────────────────────────────────────────┐ ─ S200
│       A first support layer is formed on a top portion of the first active layer          │
└─────────────────────────────────────────────────────────────────┘
                                  ↓
┌─────────────────────────────────────────────────────────────────┐ ─ S300
│   A second semiconductor base is formed on the first active layer and the first support layer   │
└─────────────────────────────────────────────────────────────────┘
                                  ↓
┌─────────────────────────────────────────────────────────────────┐ ─ S400
│ A portion of the second semiconductor base is removed to form a second active layer, in │
│ which the second active layer includes a plurality of second semiconductor pillars, and each │
│ of the plurality of second semiconductor pillars is arranged on a top surface of a respective │
│                   one of the plurality of first semiconductor pillars                     │
└─────────────────────────────────────────────────────────────────┘
                                  ↓
┌─────────────────────────────────────────────────────────────────┐ ─ S500
│       A second support layer is formed on a top portion of the second active layer         │
└─────────────────────────────────────────────────────────────────┘
                                  ↓
┌─────────────────────────────────────────────────────────────────┐ ─ S600
│ A storage structure is formed on sidewalls of the plurality of first semiconductor pillars and │
│               on sidewalls of the plurality of second semiconductor pillars                │
└─────────────────────────────────────────────────────────────────┘
```

FIG. 2

SEMICONDUCTOR STRUCTURE, METHOD FOR MANUFACTURING SEMICONDUCTOR STRUCTURE, AND MEMORY

CROSS-REFERENCE TO RELATED APPLICATIONS

This application is a continuation of International Patent Application No. PCT/CN2022/105112, filed on Jul. 12, 2022, which claims priority to Chinese Patent Application No. 202210709198.5, filed on Jun. 21, 2022. The disclosures of these applications are incorporated by reference herein in their entirety.

BACKGROUND

A storage array architecture of a Dynamic Random Access Memory (DRAM) is an array composed of a memory cell including one transistor and one capacitor (that is, 1T1C memory cell). A gate of the transistor is connected to a word line, a drain is connected to a bit line, and a source is connected to the capacitor.

As the size of the DRAM is continuously reduced, the size of the capacitor is also reduced. Therefore, how to ensure the performance of the capacitor in the DRAM has become an urgent problem to be solved.

SUMMARY

The disclosure relates to the technical field of semiconductors, and in particular to a semiconductor structure, a method for manufacturing a semiconductor structure, and a memory.

In view of this, embodiments of the disclosure provide a semiconductor structure, a method for manufacturing a semiconductor structure, and a memory.

According to an aspect of the disclosure, a semiconductor structure is provided, which includes a plurality of first semiconductor pillars, a plurality of second semiconductor pillars, a first support layer, and a storage structure.

The plurality of first semiconductor pillars are arranged in an array in a first direction and in a second direction. Each of the first direction and the second direction is perpendicular to an extending direction of each of the plurality of first semiconductor pillars, and the first direction intersects with the second direction.

The first support layer covers sidewalls of top portions of the plurality of first semiconductor pillars.

Each of the plurality of second semiconductor pillars is arranged on a respective one of the plurality of first semiconductor pillars. The storage structure is arranged around at least sidewalls of the plurality of first semiconductor pillars and sidewalls of the plurality of second semiconductor pillars.

According to another aspect of the disclosure, a memory is provided, which includes at least one semiconductor structure. The at least one semiconductor structure includes a plurality of first semiconductor pillars, a plurality of second semiconductor pillars, a first support layer, and a storage structure.

The plurality of first semiconductor pillars are arranged in an array in a first direction and in a second direction. Each of the first direction and the second direction is perpendicular to an extending direction of each of the plurality of first semiconductor pillars, and the first direction intersects with the second direction.

The first support layer covers sidewalls of top portions of the plurality of first semiconductor pillars.

Each of the plurality of second semiconductor pillars is arranged on a respective one of the plurality of first semiconductor pillars. The storage structure is arranged around at least sidewalls of the plurality of first semiconductor pillars and sidewalls of the plurality of second semiconductor pillars.

According to still another aspect of the disclosure, a method for manufacturing a semiconductor structure is provided, which includes the following operations.

A first semiconductor base is provided, and a first active layer is formed on the first semiconductor base, in which the first active layer includes a plurality of first semiconductor pillars arranged in an array in a first direction and in a second direction, each of the first direction and the second direction is perpendicular to an extending direction of each of the plurality of first semiconductor pillars, and the first direction intersects with the second direction.

A first support layer is formed on a top portion of the first active layer.

A second semiconductor base is formed on the first active layer and the first support layer.

A portion of the second semiconductor base is removed to form a second active layer, in which the second active layer includes a plurality of second semiconductor pillars, and each of the plurality of second semiconductor pillars is arranged on a top surface of a respective one of the plurality of first semiconductor pillars.

A second support layer is formed on a top portion of the second active layer.

A storage structure is formed on sidewalls of the plurality of first semiconductor pillars and on sidewalls of the plurality of second semiconductor pillars.

BRIEF DESCRIPTION OF THE DRAWINGS

FIG. 1 is a schematic diagram of circuit connection of a DRAM transistor according to an embodiment of the disclosure;

FIG. 2 is a flowchart of a method for manufacturing a semiconductor structure according to an embodiment of the disclosure.

DETAILED DESCRIPTION

Figure 3:
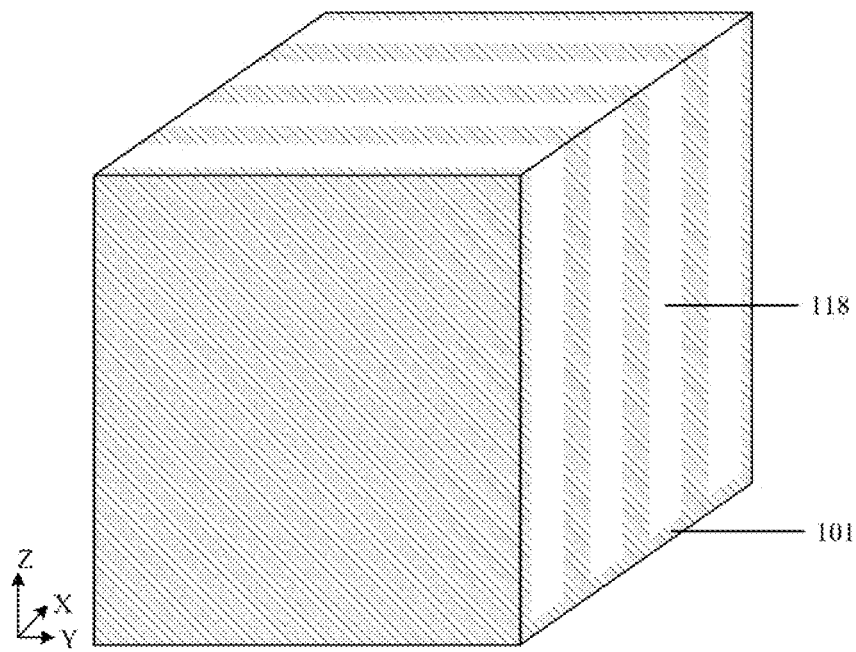
FIG. 3 to FIG. 30 are schematic cross-sectional views of a process for manufacturing a semiconductor structure according to an embodiment of the disclosure.

In order to make the technical solutions and advantages of the embodiments of the present disclosure clearer, the technical solutions of the present disclosure will be further described in details below with reference to the accompanying drawings and the embodiments. Although the exemplary implementations of the disclosure are shown in the accompanying drawings, it should be understood that the present disclosure may be implemented in various forms and cannot be limited by the implementations illustrated herein. On the contrary, the implementations are provided to more thoroughly understand the present disclosure and to completely convey the scope of the present disclosure to those skilled in the art.

The disclosure is described more specifically by way of example in the following paragraphs with reference to the accompanying drawings. The advantages and features of the present disclosure will become apparent in light of the following descriptions and claims. It should be noted that the accompanying drawings are provided in a very simplified form not necessary drawn to exact scale, and are only intended to facilitate convenience and clarify in explaining the embodiments of the present disclosure.

It may be understood that the meanings of "on . . . " "over" and "above" in the present disclosure should be read in the broadest manner, so that "on . . . " not only means that it is "on" something without any intervening features or layers therebetween (i.e., directly on something), but also includes the meaning of being "on" something with intervening features or layers therebetween.

In addition, for the convenience of description, spatial relative terms such as "on", "above", "over", "top" and "upper" may be used herein to describe a relationship of one element or feature and another element or feature as shown in the figures. In addition to the orientations shown in the figures, the spatial relative terms are intended to include different orientations of the devices in use or operation. The device may be otherwise oriented (rotated by 90 degrees or in other orientations) and the spatial relative descriptors used herein may also be explained accordingly.

In the embodiments of the disclosure, the term "substrate" refers to a material on which subsequent material layers are added. The substrate itself may be patterned. The material added on the top portion of the substrate may be patterned or may remain unpatterned. In addition, the substrate may include various semiconductor materials, such as silicon, silicon germanium, germanium, arsenide, indium phosphide, etc. Alternatively, the substrate may be made of a non-conductive material, such as glass, plastic or sapphire wafers.

In the embodiments of the disclosure, the term "layer" refers to a portion of material that includes an area having a thickness. The layer may extend over the entirety of the structure below or above the layer, or may have an extent smaller than the extent of the structure below or above the layer. Moreover, the layer may be an area of homogeneous or inhomogeneous continuous structure having a thickness less than the thickness of the continuous structure. For example, the layer may be located between the top surface and the bottom surface of the continuous structure, or the layer may be arranged between any pairs of the horizontal faces at the top surface and bottom surface of the continuous structure. The layer may extend horizontally, vertically, and/or along an inclined surface. The layer may include a plurality of sub-layers. For example, the interconnection layer may include one or more conductor and contact sub-layers (in which interconnection wires and/or through-hole contacts are formed), and one or more dielectric sub-layers.

In the embodiment of the disclosure, the terms "first", "second" and the like are intended to distinguish similar objects but do not necessarily indicate a specific sequence or order.

The semiconductor structure involved in the embodiments of the disclosure is at least a part that will be used in the subsequent process to form the final device structure. Herein, the final device may include a memory. The memory includes, but is not limited to, a DRAM. The DRAM is only taken as an example for description below.

It should be noted that, the description about the DRAM in the following embodiments is only used for illustrating the disclosure, but not for limiting the scope of the disclosure.

With the development of the DRAM technology, the size of the memory cell becomes smaller and smaller, and its array architecture changes from $8F^2$ to $6F^2$ to $4F^2$. In addition, based on the requirements for ions and leakage current in the DRAM, the architecture of the memory changes from Planar Array Transistor to Recess Gate Array Transistor, from the Recess Gate Array Transistor to Buried Channel Array Transistor, and then from the Buried Channel Array Transistor to Vertical Channel Array Transistor.

In some embodiments of the disclosure, regardless of whether the architecture of the memory is the Planar Array Transistor, the Recess Gate Array Transistor, the Buried Channel Array Transistor, or the Vertical Channel Array Transistor, the DRAM is composed of a plurality of memory cells. The structure of each memory cell is mainly composed of one transistor and one memory cell (storage capacitor) controlled by the transistor. That is, the DRAM includes the architecture of one Transistor (T) and one Capacitor (C) (1T1C), and its main principle is to use the amount of charges stored in the capacitor to represent whether a binary bit is 1 or 0.

FIG. 1 is a schematic diagram of circuit connection using the 1T1C architecture according to an embodiment of the disclosure. As shown in FIG. 1, the drain of the transistor T is electrically connected to a Bit Line (BL), the source of the transistor T is electrically connected to one electrode plate of the capacitor C, another electrode plate of the capacitor C may be connected to a reference voltage which may be a ground voltage or other voltages, and the gate of the transistor T is connected to a Word Line (WL). The voltage is applied through the word line WL to control the transistor T to be turned on or turned off. The bit line BL is configured to perform a read or write operation on the transistor T when the transistor T is turned on.

However, with the development of the memory, the size of the DRAM is continuously reduced, and the storage capacity of the memory is continuously increased, so that the process of forming the capacitor becomes more and more difficult, resulting in a risk of collapse.

Based on this, in order to solve one or more of the above problems, an embodiment of the disclosure provides a method for manufacturing a semiconductor structure, which can solve the collapse problem. FIG. 2 is a flowchart of a method for manufacturing a semiconductor structure according to an embodiment of the disclosure. As shown in FIG. 2, the method for manufacturing the semiconductor structure provided in the embodiment of the disclosure includes the following operations.

In S100, a first semiconductor base is provided, and a first active layer is formed on the first semiconductor base, in which the first active layer includes a plurality of first semiconductor pillars arranged in an array in a first direction and in a second direction, each of the first direction and the second direction is perpendicular to an extending direction of each of the plurality of first semiconductor pillars, and the first direction intersects with the second direction.

In S200, a first support layer is formed on a top portion of the first active layer.

In S300, a second semiconductor base is formed on the first active layer and the first support layer.

In S400, a portion of the second semiconductor base is removed to form a second active layer, in which the second active layer includes a plurality of second semiconductor pillars, and each of the plurality of second semiconductor pillars is arranged on a top surface of a respective one of the plurality of first semiconductor pillars.

In S500, a second support layer is formed on a top portion of the second active layer.

In S600, a storage structure is formed on sidewalls of the plurality of first semiconductor pillars and on sidewalls of the plurality of second semiconductor pillars.

It should be understood that, the operations shown in FIG. 2 are not exclusive, and additional operations may also be performed before and after any operation or between any operations during operations. The sequence of the operations shown in FIG. 2 may be adjusted according to actual needs. FIG. 3 to FIG. 30 are schematic cross-sectional views of a process for manufacturing a semiconductor structure according to an embodiment of the disclosure. It should be noted that, FIG. 3 to FIG. 30 are schematic diagrams completely reflecting an implementation process of a method for manufacturing a semiconductor structure. Unmarked portions in some drawings can be shared with each other. The method for manufacturing the semiconductor structure provided in the embodiment of the disclosure is further described in detail below with reference to FIG. 2 and FIG. 3 to FIG. 30.

In S100, a first active layer composed of a plurality of first semiconductor pillars 102 is formed on a first semiconductor base 101.

In some embodiments, the operation that the first active layer is formed includes the following operations.

A plurality of first trenches 118 spaced apart from each other in the first direction and a plurality of second trenches 119 spaced apart from each other in the second direction are formed in the first semiconductor base 101. The first semiconductor base 101 is divided into the plurality of first semiconductor pillars 102 by the plurality of first trenches 118 and the plurality of second trenches 119.

A bottom portion of each of the plurality of first trenches 118 and/or a bottom portion of each of the plurality of second trenches 119 are/is expanded, so as to allow each of the plurality of formed first semiconductor pillars 102 to include a first portion 102-1 and a second portion 102-2 arranged on the first portion 102-1. A maximum diameter width of the first portion 102-1 is less than a minimum diameter width of the second portion 102-2.

In some specific examples, the first semiconductor base 101 includes, but is not limited to, a substrate. The substrate may include an elemental semiconductor material substrate (for example, a silicon (Si) substrate, a germanium (Ge) substrate, etc.), a compound semiconductor material substrate (for example, a silicon germanium (SiGe) substrate, etc.), a Silicon-On-Insulator (SOI) substrate, a Germanium-On-Insulator (GeOI) substrate, etc. Preferably, the substrate is a silicon substrate.

A process for forming the first semiconductor pillars 102 is described below in detail with reference to FIG. 3 to FIG. 6.

As shown in FIG. 3, first etching is performed on a surface of the first semiconductor base 101, so as to form, in the first semiconductor base 101, the plurality of first trenches 118 spaced apart from each other in the first direction. Here, each first trench 118 extends in the second direction.

Here, the first direction is parallel to the surface of the first semiconductor base 101. The second direction intersects with the first direction, and is parallel to the surface of the first semiconductor base 101. A third direction is an extending direction of the first semiconductor pillar 102, and the third direction is perpendicular to the surface of the first semiconductor base 101.

Here, the first direction intersects with the second direction. It can be understood that, an included angle between the first direction and the second direction ranges from 0 to 90 degrees.

For clear description of the disclosure, the following embodiments are described by taking the first direction being perpendicular to the second direction as an example. Exemplarily, the first direction is an X-axis direction shown in FIG. 3, the second direction is a Y-axis direction shown in FIG. 3, and the third direction is a Z-axis direction shown in FIG. 3. It should be noted that, the description about directions in the following embodiments is only used for illustrating the disclosure, but not for limiting the scope of the disclosure.

In some specific examples, the first trench 118 includes, but is not limited to, a Shallow Trench Isolation (STI) structure.

In some specific examples, a method for forming the first trench 118 includes, but is not limited to, a dry plasma etching process.

Figure 4:
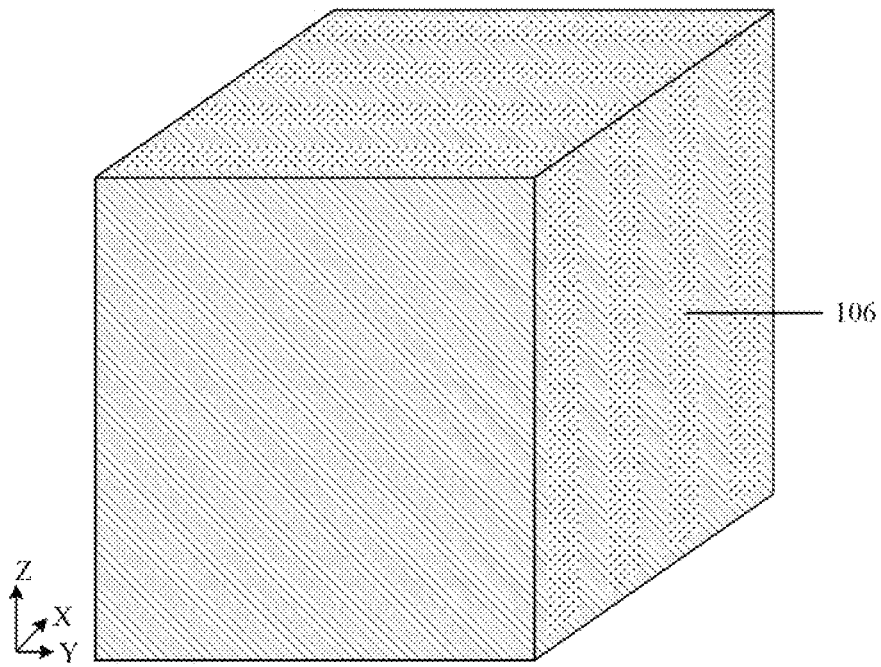

As shown in FIG. 4, a first insulation layer 106 is formed in each of the plurality of first trenches 118. A top surface of the first insulation layer 106 is substantially flush with a top surface of the first semiconductor base 101. Here, the first insulation layer 106 is configured for supporting.

It should be noted that, "substantially flush" involved in the disclosure may be understood as approximately flush. It can be understood that, during manufacturing of the memory, misalignment or non-flush caused by process error is also included in the range of substantially flush.

In some specific examples, a constituent material of the first insulation layer 106 includes, but is not limited to, silicon oxide ($SiO_2$).

In some specific examples, a method for forming the first insulation layer 106 includes, but is not limited to, a process such as a Physical Vapor Deposition (PVD) process, a Chemical Vapor Deposition (CVD) process, an Atomic Layer Deposition (ALD) process, etc.

Figure 5:
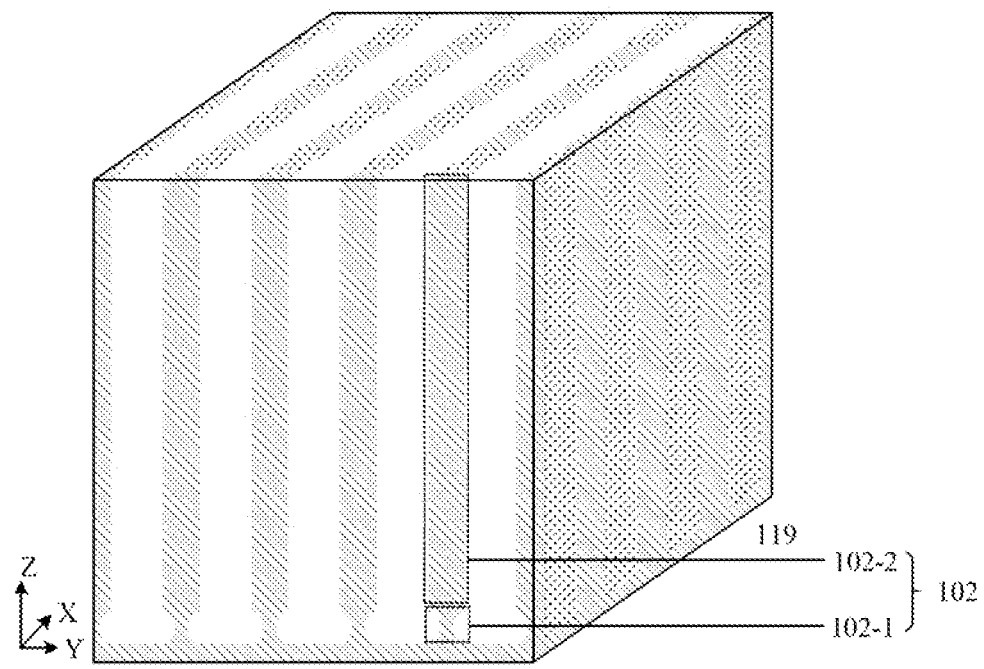

As shown in FIG. 5, second etching is performed on the first semiconductor base 101 with the first insulation layers 106, so as to form the plurality of second trenches 119 in the first semiconductor base 101. The plurality of second trenches 119 are spaced apart from each other in the second direction, and each of the plurality of second trenches 119 extends in the first direction. That is, the first trenches 118 intersect with the second trenches 119.

In some specific examples, in a case that the first direction is perpendicular to the second direction, the first trench 118 is perpendicular to the second trench 119.

In some specific examples, the plurality of first trenches 118 are spaced apart from each other in the X-axis direction, and each first trench 118 extends in the Y-axis direction. The plurality of second trenches 119 are spaced apart from each other in the Y-axis direction, and each second trench 119 extends in the X-axis direction.

In some specific examples, a method for forming the second trenches 119 includes, but is not limited to, a dry plasma etching process.

In some specific examples, the second trench 119 includes, but is not limited to, an STI structure.

Here, the first semiconductor base 101 is divided into the plurality of first semiconductor pillars 102 arranged in an array in the first direction and in the second direction by the plurality of first trenches 118 and the plurality of second trenches 119.

In some specific examples, a grid-shaped mask layer may also be formed on the surface of the first semiconductor base 101. The first semiconductor base 101 is etched by using the grid-shaped mask layer as a mask to simultaneously form the first trenches 118 and the second trenches 119, so as to form, in the first semiconductor base 101, the plurality of first semiconductor pillars 102 arranged in an array in the first direction and in the second direction.

Next, as shown in FIG. 5, a bottom portion of each of the plurality of first trenches 118 and/or a bottom portion of each of the plurality of second trenches 119 are/is expanded. Here, the expanding process may be understood that the bottom portion of the first trench 118 is etched in the first direction, and/or the bottom portion of the second trench 119 is etched in the second direction, so that a diameter width of the bottom portion of the first trench 118 and/or a diameter width of the bottom portion of the second trench 119 in the first direction is greater than a diameter width of a top portion of the respective trench in the first direction;
and/or
a diameter width of the bottom portion of the first trench 118 and/or a diameter width of the bottom portion of the second trench 119 in the second direction is greater than a diameter width of a top portion of the respective trench in the second direction.

In some specific examples, the used etching process may include a wet etching process, a dry etching process, etc.

Exemplarily, in the wet etching process, an etchant is introduced into the bottom portion of the first trench 118 and/or the bottom portion of the second trench 119. By means of anisotropic etching of the etchant, the diameter width of the bottom portion of the first trench 118 and/or the diameter width of the bottom portion of the second trench 119 in the X-axis direction are/is increased, and/or, the diameter width of the bottom portion of the first trench 118 and/or the diameter width of the bottom portion of the second trench 119 in the Y-axis direction are/is increased.

Exemplarily, in the dry etching process, lateral etching is performed by controlling plasma, so as to form a trench structure with an expanded diameter width is formed at the bottom portion of the first trench 118 and/or the bottom portion of the second trench 119.

In the embodiments of the disclosure, after the bottom portion of each first trench 118 and/or the bottom portion of each second trench 119 are/is expanded, bottom areas of the plurality of first semiconductor pillars 102 arranged on the first semiconductor base 101 are etched through the etching process, so that sizes of the bottom areas of the first semiconductor pillars 102 are reduced.

In other words, each of the plurality of first semiconductor pillars 102 includes a first portion 102-1 and a second portion 102-2 arranged on the first portion 102-1. Here, the second portion 102-2 of the first semiconductor pillar 102 is arranged on the first portion 102-1 of the first semiconductor pillar 102.

Exemplarily, when only the first trench 118 is expanded, a maximum diameter width of the first portion 102-1 of the first semiconductor pillar 102 in the X-axis direction is less than a minimum diameter width of the second portion 102-2 of the first semiconductor pillar 102 in the X-axis direction.

Exemplarily, when only the second trench 119 is expanded, the maximum diameter width of the first portion 102-1 of the first semiconductor pillar 102 in the Y-axis direction is less than the minimum diameter width of the second portion 102-2 of the first semiconductor pillar 102 in the Y-axis direction.

Exemplarily, when both the first trench 118 and the second trench 119 are expanded, the maximum diameter width of the first portion 102-1 of the first semiconductor pillar 102 in the X-axis direction is less than the minimum diameter width of the second portion 102-2 of the first semiconductor pillar 102 in the X-axis direction, and the maximum diameter width of the first portion 102-1 of the first semiconductor pillar 102 in the Y-axis direction is less than the minimum diameter width of the second portion 102-2 of the first semiconductor pillar 102 in the Y-axis direction.

Preferably, both the first trench 118 and the second trench 119 are expanded, so that a size of the first portion 102-1 of the first semiconductor pillar 102 is reduced.

Exemplarily, the maximum diameter width of the first portion 102-1 may be understood as a diameter width of a contact position between the first portion 102-1 of the first semiconductor pillar 102 and the second portion 102-2 of the first semiconductor pillar 102 in FIG. 5. The minimum diameter width of the second portion 102-2 may be understood as an area with a minimum size in the second portion 102-2 of the first semiconductor pillar 102. With reference to FIG. 5, sizes of upper portion and lower portion of the second portion 102-2 of the first semiconductor pillar 102 are the same. That is, the minimum diameter width and the maximum diameter width of the second portion 102-2 of the first semiconductor pillar 102 are the same.

Figure 6:
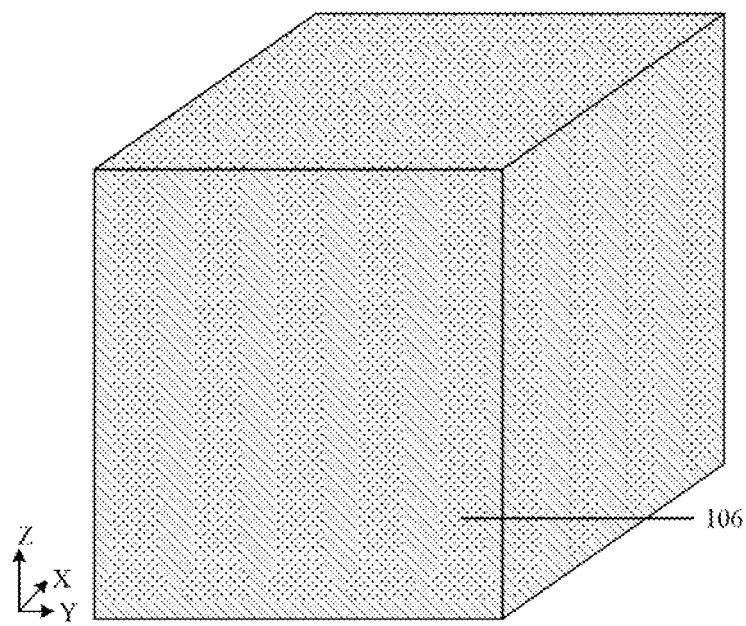

Next, as shown in FIG. 6, the first insulation layer 106 is formed in each of the plurality of second trenches 119. The top surface of the first insulation layer 106 is substantially flush with the top surface of the first semiconductor base 101. The first insulation material layer is configured for supporting.

It should be noted that, the sequence of forming the first trenches 118 and the second trenches 119, and filling the first trenches 118 and the second trenches 119 with the first insulation material to form the first insulation layer 106 may be selected according to actual situations. In some other specific embodiments, the first trenches 118 and the second trenches 119 may be firstly formed, and then the first insulation layer 106 may be formed in the first trenches 118 and the second trenches 119.

As shown in FIG. 7 to FIG. 10, in S200, a first support layer 109 is formed on a top portion of the first active layer.

In some embodiments, the method further includes the following operation. Before the first support layer 10) is formed, a first insulation layer 106 (as shown in FIG. 6) is formed in gaps between the plurality of first semiconductor pillars 102.

The operation that the first support layer 109 is formed includes the following operations.

A portion of the first insulation layer 106 is removed to form a plurality of first grooves 107.

A first support pillar 109-1 is formed in each of the plurality of first grooves 107.

A portion of the first insulation layer 106 is removed to form a plurality of second grooves 108.

A second support pillar 109-2 is formed in each of the plurality of second grooves 108.

A plurality of first support pillars 109-1 and a plurality of second support pillars 109-2 collectively form the first support layer 109. Each of the plurality of first support pillars 109-1 is arranged between top portions of two first semiconductor pillars 102 adjacent to each other in the second direction. Each of the plurality of second support pillars 109-2 is arranged between top portions of two first semiconductor pillars 102 adjacent to each other in the first direction. The first support layer 109 covers a portion of the sidewall of the top portion of each of the plurality of first semiconductor pillars 102.

Figure 7:
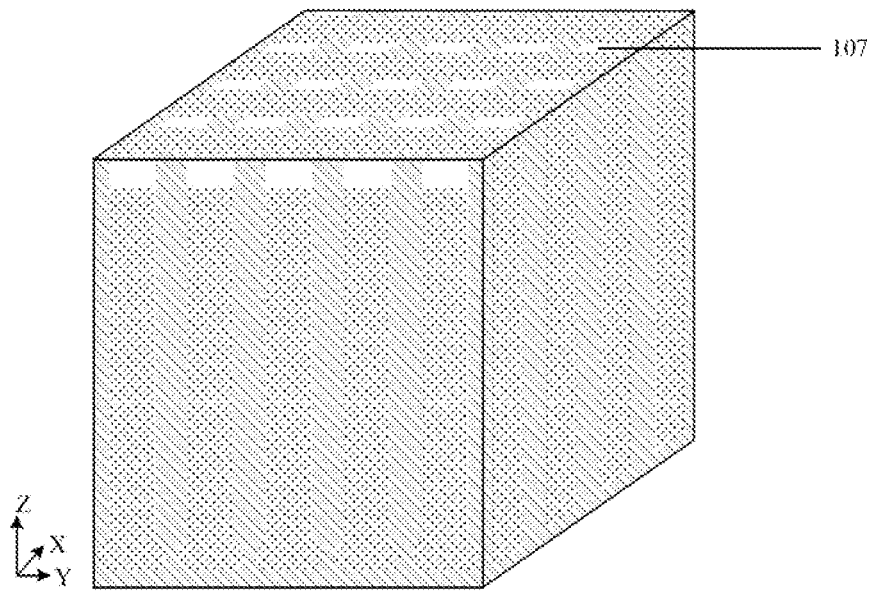

As shown in FIG. 7, a portion of the first insulation layer 106 on the top portions of the first semiconductor pillars 102 is removed to form the plurality of first grooves 107. Each first groove 107 is arranged between the top portions of two first semiconductor pillars 102 adjacent to each other in the second direction. The plurality of first grooves 107 are spaced apart from each other in the X-axis direction, and each first groove 107 extends in the Y-axis direction.

In some specific examples, a method for removing the portion of the first insulation layer 106 on the top portions of the first semiconductor pillars 102 includes, but is not limited to, a dry etching process and a wet etching process.

Figure 8:
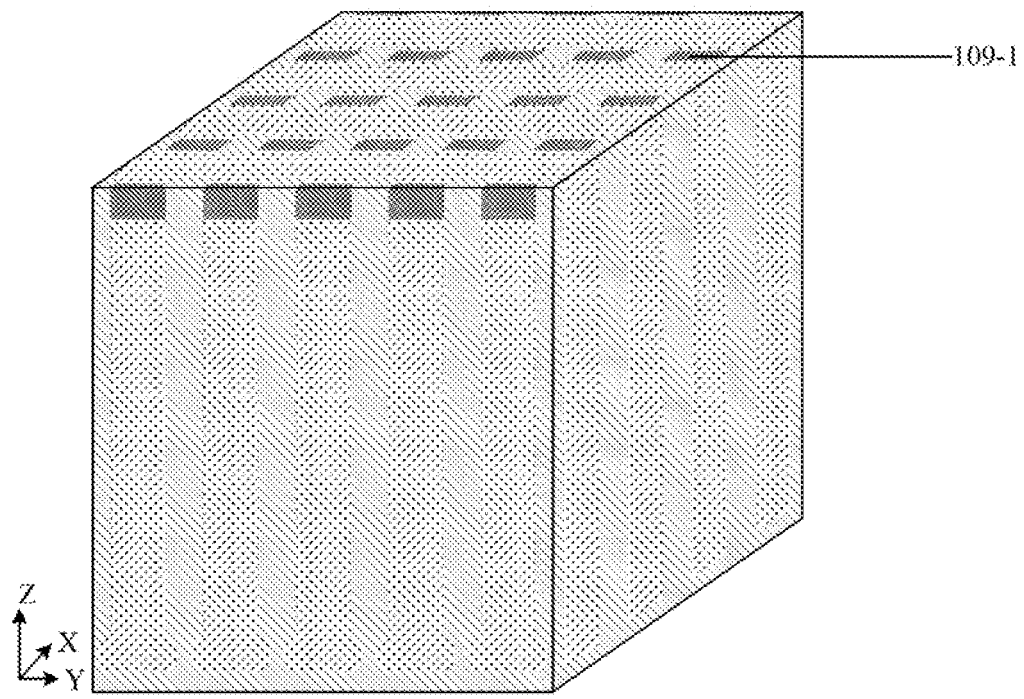

Next, as shown in FIG. 8, a first support pillar 109-1 is formed in each of the plurality of first grooves 107.

In some specific examples, a method for forming the first support pillars 109-1 includes, but is not limited to, a process such as a PVD process, a CVD process, an ALD process, etc.

Here, a material of the first support pillar 109-1 includes, but is not limited to, silicon nitride.

Figure 9:
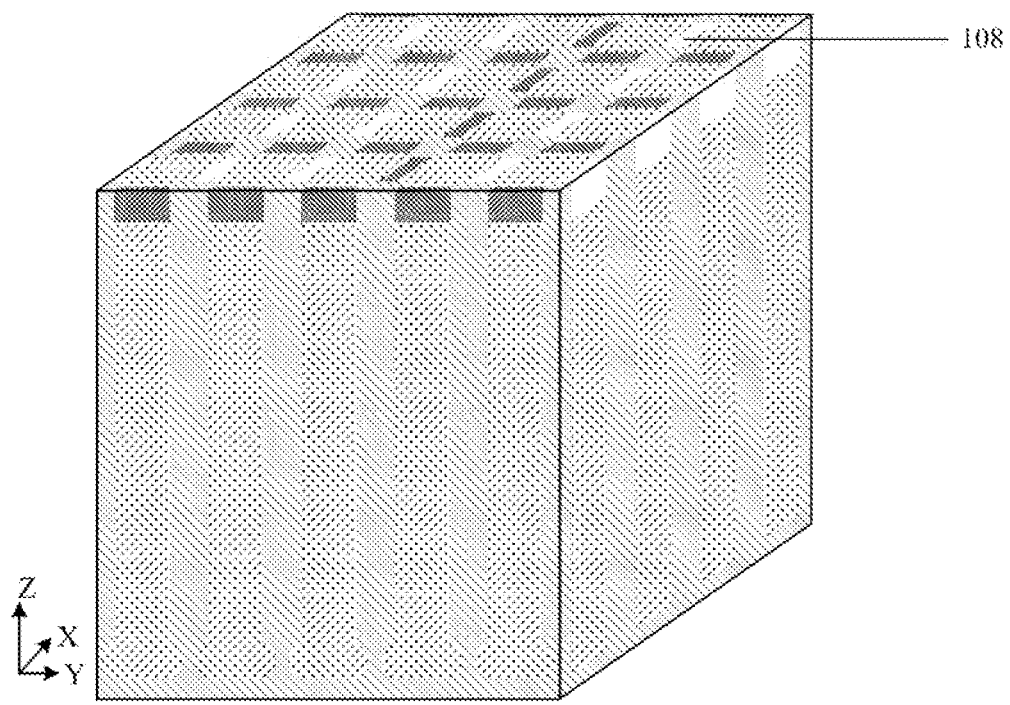

Next, as shown in FIG. 9, a portion of the first insulation layer 106 on the top portions of the first semiconductor pillars 102 is removed to form a plurality of second grooves 108. Each second groove 108 is arranged between the top portions of two first semiconductor pillars 102 adjacent to each other in the first direction. The plurality of second grooves 108 are spaced apart from each other in the Y-axis direction, and each second groove 108 extends in the X-axis direction.

Figure 10:
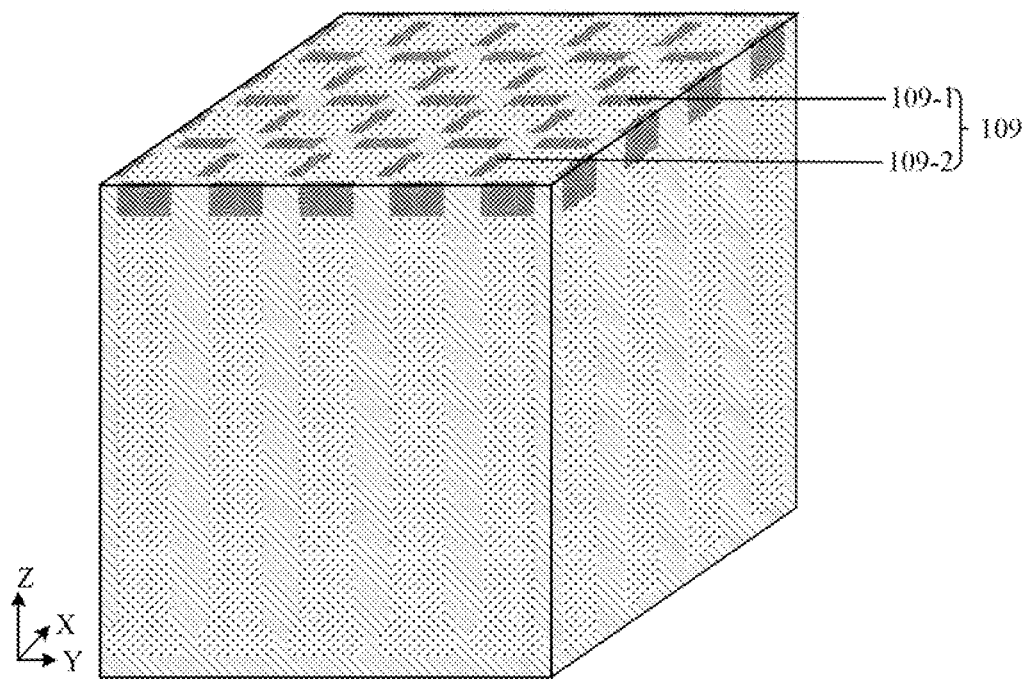

Next, as shown in FIG. 10, a second support pillar 109-2 is formed in each of the plurality of second grooves 108.

In some specific examples, a method for forming the second support pillars 109-2 includes, but is not limited to, a process such as a PVD process, a CVD process, an ALD process, etc.

Here, the material of the first support pillar 109-1 may be the same as or different from the material of the second support pillar 109-2.

In some specific examples, after the first support layer 109 is formed in the first grooves 107 and the second grooves 108, the method further includes the following operation. The first support layer 109 is planarized, so that the first support layer 109 is flush with the top surface of the first semiconductor pillar 102.

In some specific examples, the planarization process includes, but is not limited to, a Chemical Mechanical Polishing (CMP) technology.

Here, the formed first support pillars 109-1 and the formed second support pillars 109-2 collectively form the first support layer 109. As shown in FIG. 10, the first support layer 109 is of a net-shaped structure, and the first support layer 109 covers a portion of the sidewall of the top portion of each of the first semiconductor pillars 102.

In some other specific examples, a grid-shaped mask layer may also be formed on the first semiconductor pillars 102. The first insulation layer 106 is etched by using the grid-shaped mask layer as a mask, so as to simultaneously form the first grooves 107 and the second grooves 108. In addition, while the first support pillar 109-1 is formed in the first groove 107, the second support pillar 109-2 is simultaneously formed in the second groove 108.

Here, the first support layer 109 covering a portion of the sidewall of the top portion of each of the first semiconductor pillars 102 can be understood that, the first support pillars 109-1 cover a portion of the sidewall of the top portion of each of the first semiconductor pillars 102, and/or the second support pillars 109-2 cover a portion of the sidewall of the top portion of each of the first semiconductor pillars 102. That is, at least a portion of first support layer 109 covers the portion of the sidewall of the top portion of the first semiconductor pillar 102. The first support layer 109 should cover the sidewalls of the top portions of the first semiconductor pillars 102, but cannot completely cover the sidewalls of the top portions of the first semiconductor pillars 102. It can be understood that, in the first aspect, the first support layer 109 can only support the first semiconductor pillars 102 by covering the sidewalls of the top portions of the first semiconductor pillars 102. The more the portion of the sidewall of the top portion of the first semiconductor pillar 102 covered by the first support layer 109, the better the supporting effect. In the second aspect, if the first support layer 109 completely covers the sidewalls of the first semiconductor pillars 102, when a storage structure 105 is formed in the subsequent process, the material of the first electrode can be only filled in the gaps between the second semiconductor pillars 104, but cannot be filled downward into the gaps between the first semiconductor pillars 102.

It can be understood that, as the current requirements for memory density continue to increase, the depth-to-width ratio of the first semiconductor pillar 102 is continuously increased, so that a risk of collapse is likely to occur during the formation of the first semiconductor pillars 102. In the embodiments of the disclosure, at least a portion of first support layer 109 covers the portion of the sidewall of the top portion of each of the first semiconductor pillars 102, so that the plurality of first semiconductor pillars 102 can be connected to each other. Therefore, when the first insulation layer 106 is removed in the subsequent process, the first semiconductor pillars 102 may be supported, and the first semiconductor pillar 102 with a larger depth-to-width ratio is not easily collapsed.

The above introduces the process of forming the first semiconductor pillars 102 on the first semiconductor base 101. In the actual application, the storage capacity of the storage structure formed in the gaps between the semiconductor pillars with a certain height may be insufficient, so that the height of the semiconductor pillar should be further increased, thereby forming the storage structure with a larger capacity in the gaps between the heightened semiconductor pillars. However, the heightened semiconductor pillars are more prone to collapse. In order to further solve the above collapse problem, the embodiments of the disclosure further provide the following technical solutions.

In S300, a second semiconductor base 103 is formed.

In some embodiments, the operation that the second semiconductor base 103 is formed includes the following operations.

A portion of the first support layer 109 and a portion of the first insulation layer 106 are removed to expose a portion of the sidewall of the top portion of each of the plurality of first semiconductor pillars 102.

The second semiconductor base 103 is formed on the plurality of first semiconductor pillars 102, on a remaining portion of the first support layer 109, and on a remaining portion of first insulation layer 106 through an epitaxial growth process.

Figure 11:
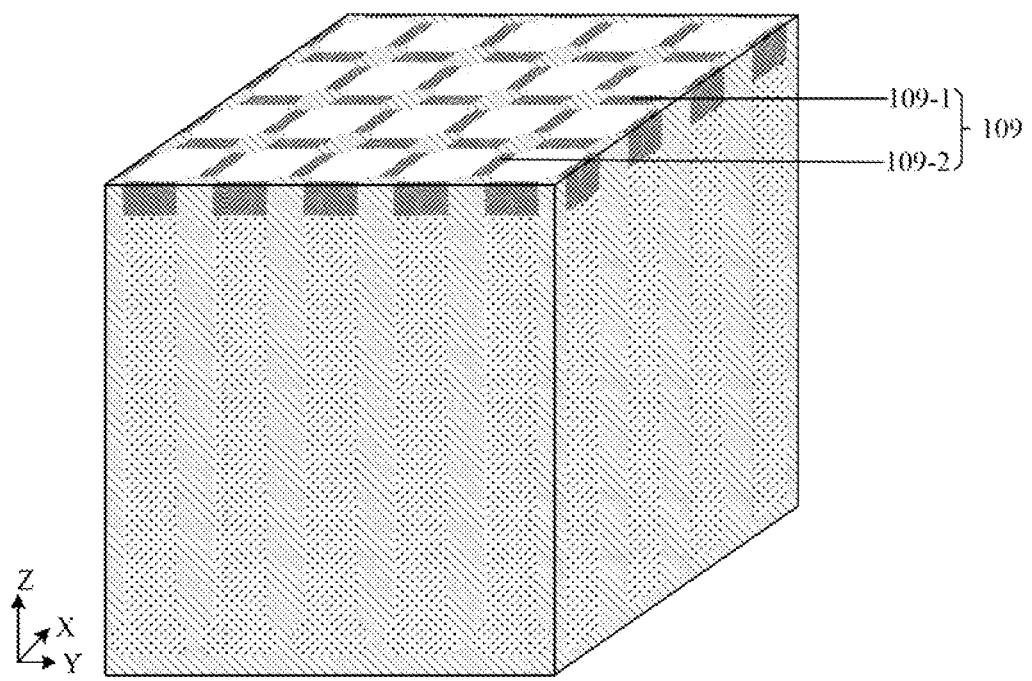

As shown in FIG. 11, the first insulation layer 106 on the top portions of the first semiconductor pillars 102 is removed to expose the portion of the sidewall of the top portion of each of the first semiconductor pillars 102.

In some embodiments, a method for removing the first insulation layer 106 on the top portions of the first semiconductor pillars 102 includes, but is not limited to, a dry etching process and a wet etching process.

Figure 12:
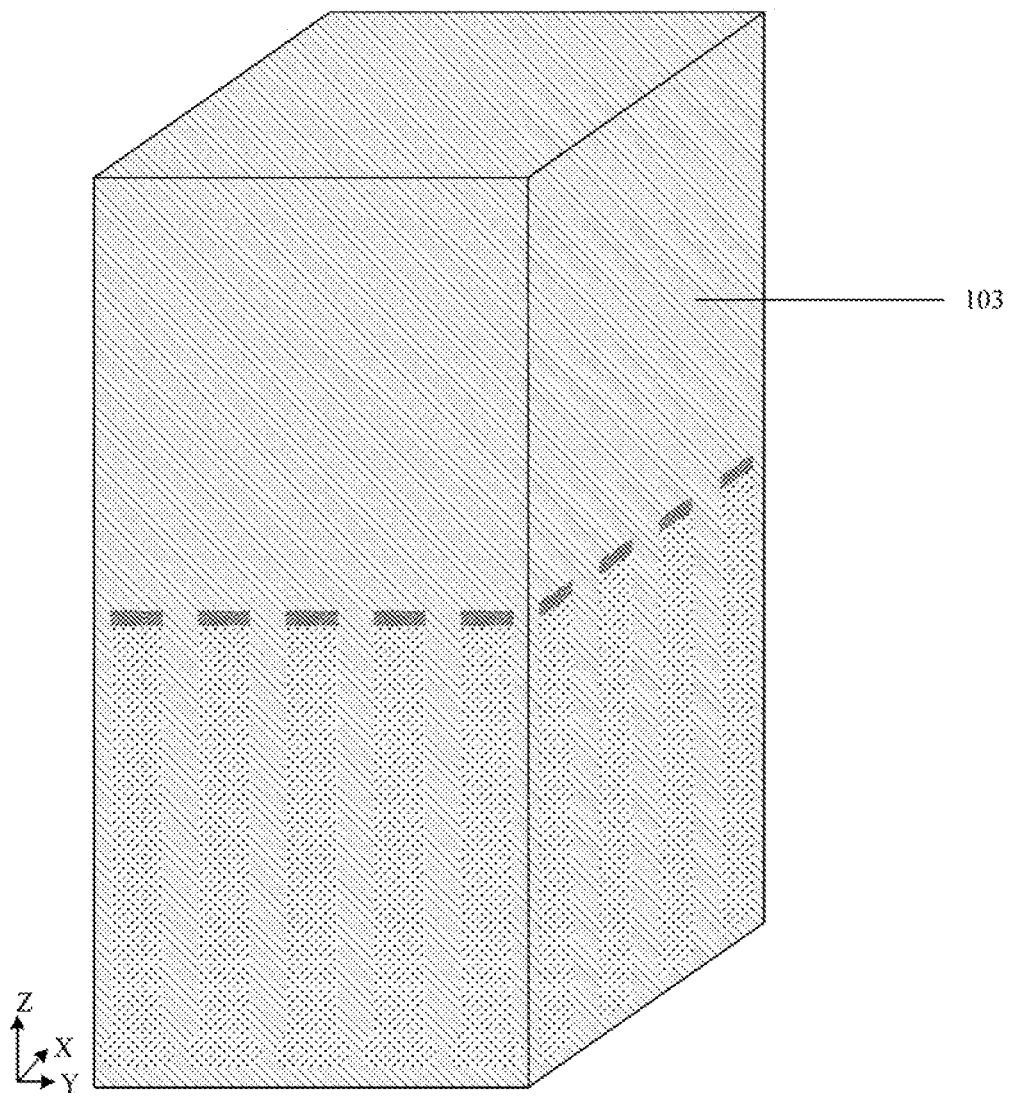

Next, as shown in FIG. 12, the second semiconductor base 103 is formed on the plurality of first semiconductor pillars 102 and the first support layer 109.

In some specific examples, a method for forming the second semiconductor base 103 includes, but is not limited to, an epitaxial growth process.

It can be understood that, the purpose of removing the first insulation layer 106 on the top portions of the first semiconductor pillars 102 to expose the portion of the sidewall of the top portion of each of the first semiconductor pillars 102 in the above embodiment is mainly to more conveniently form the second semiconductor base 103 through the epitaxial growth process.

In some specific examples, the material of the first semiconductor base 101 may include an elemental semiconductor material (for example, silicon, germanium, etc.), a compound semiconductor material (for example, silicon germanium, etc.), etc. The material of the second semiconductor base 103 may be the same as or different from the material of the first semiconductor base 101.

In S400, a second active layer composed of the plurality of second semiconductor pillars 104 is formed.

Figure 13:
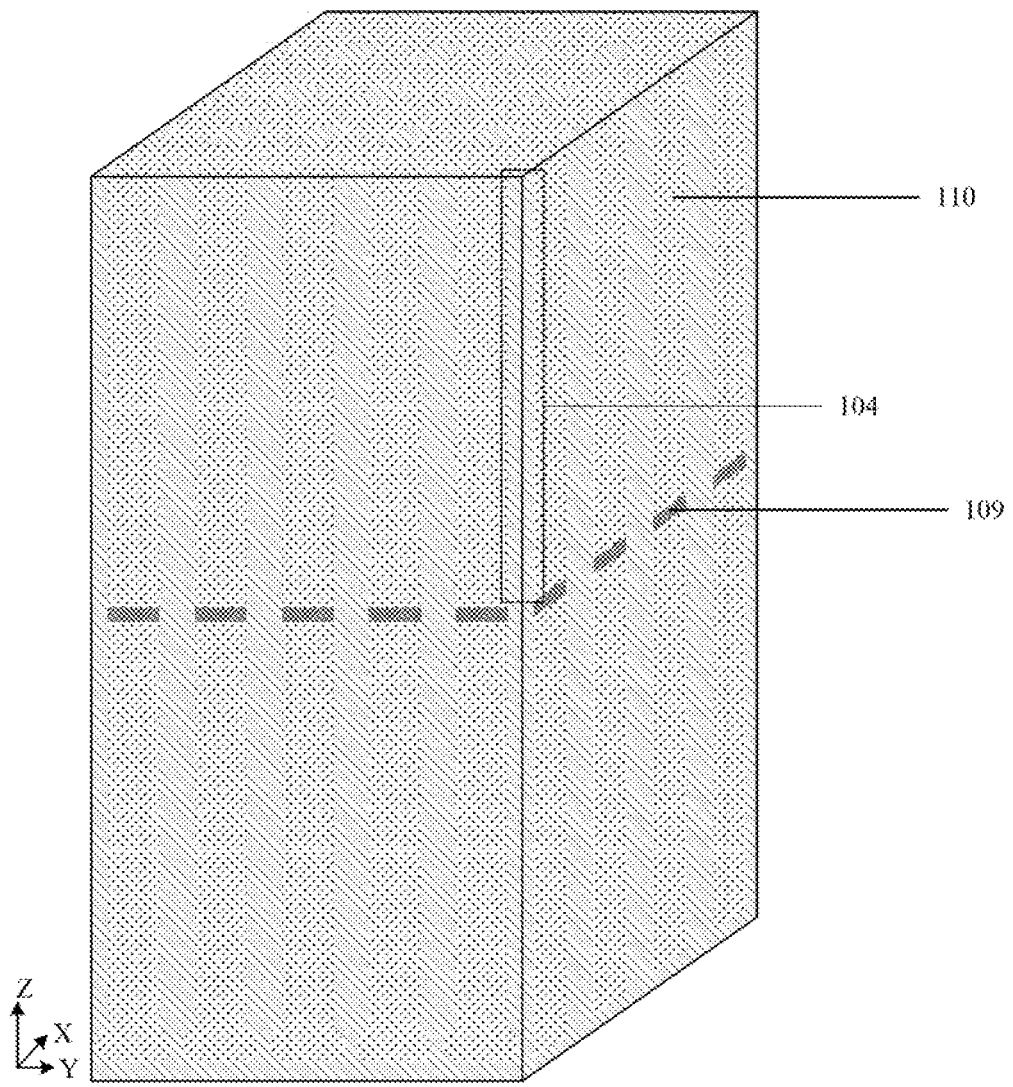

As shown in FIG. 13, the plurality of second semiconductor pillars 104 are formed. Each of the plurality of second semiconductor pillars 104 is arranged on the top surface of a respective one of the plurality of first semiconductor pillars 102. A second insulation layer 110 is formed in gaps between the plurality of second semiconductor pillars 104.

Here, a material of the second insulation layer 110 includes, but is not limited to, silicon oxide. The material of the second insulation layer 110 is the same as or different from the material of the first insulation layer 106.

Here, the process of forming the second semiconductor pillars 104 on the first semiconductor pillars 102 is similar to the process of forming the first semiconductor pillars 102 in the foregoing embodiments, which is not repeated herein.

Figure 14:
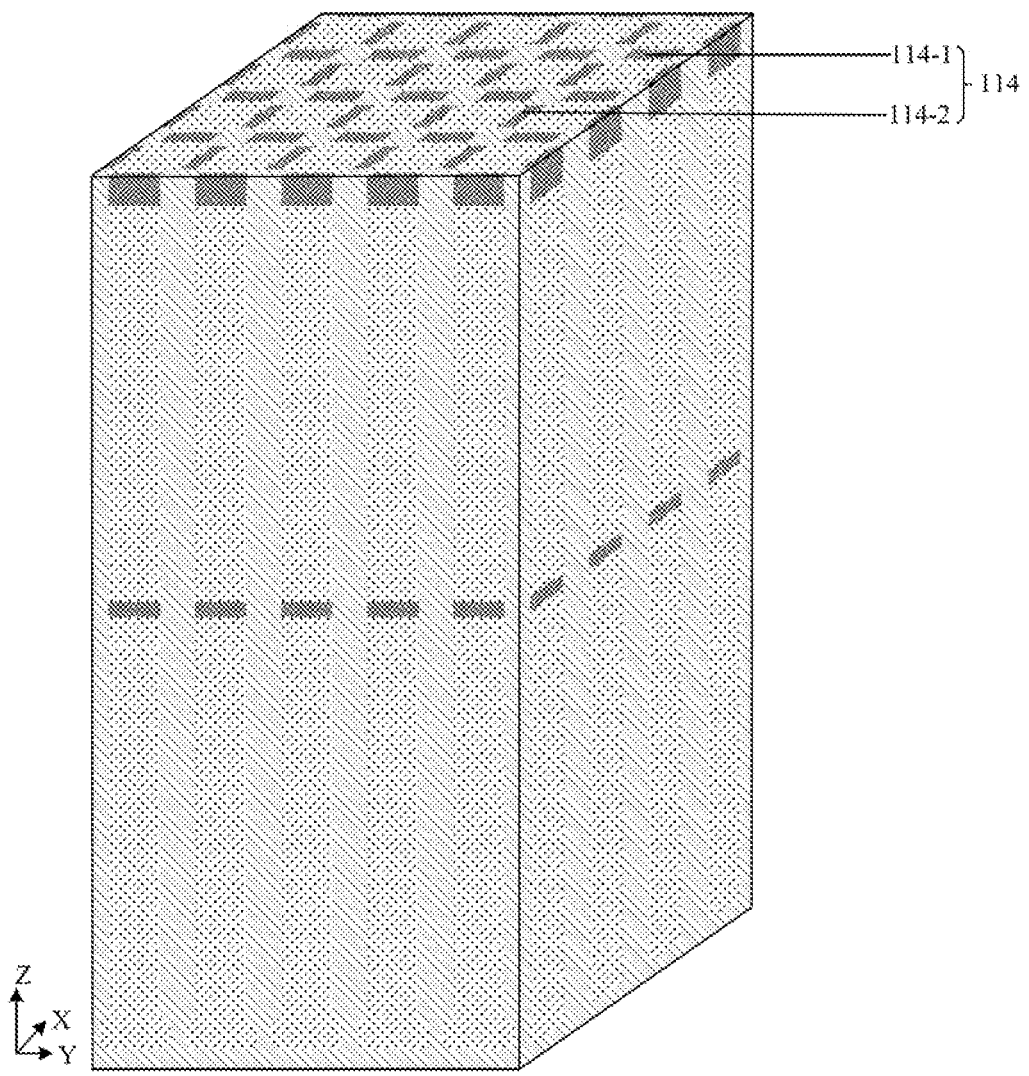

As shown in FIG. 14, in S500, a second support layer 114 is formed.

In some embodiments, the method further includes the following operations.

Before the second support layer 114 is formed, a second insulation layer 110 is formed in gaps between the plurality of second semiconductor pillars 104.

The operation that the second support layer 114 is formed includes the following operations.

A portion of the second insulation layer 110 is removed to form a plurality of third grooves.

A third support pillar 114-1 is formed in each of the plurality of third grooves.

A portion of the second insulation layer 110 is removed to form a plurality of fourth grooves.

A fourth support pillar 114-2 is formed in each of the plurality of fourth grooves.

A plurality of third support pillars 114-1 and a plurality of fourth support pillars 114-2 collectively form the second support layer 114. Each of the plurality of third support pillars 114-1 is arranged between top portions of two second semiconductor pillars 104 adjacent to each other in the second direction. Each of the plurality of fourth support pillars 114-2 is arranged between top portions of two second semiconductor pillars 104 adjacent to each other in the first direction. The second support layer 114 covers a portion of the sidewall of the top portion of each of the plurality of second semiconductor pillars 104.

Here, a material of the second support layer 114 includes, but is not limited to, silicon nitride. The material of the second support layer 114 is the same as or different from the material of the first support layer 109.

Here, the process of forming the second support layer 114 on the top portion of the second active layer is similar to the process of forming the first support layer 109 on the top portion of the first active layer in the foregoing embodiments, which is not repeated herein.

It can be understood that, the second support layer 114 here is configured to support the second semiconductor pillars 104, so that the second semiconductor pillars 104 is not likely to collapse after the first insulation layer 106 and the second insulation layer 110 are removed in the subsequent process.

As shown in FIG. 15 to FIG. 27, in S600, a storage structure 105 is formed.

In some embodiments, the operation that the storage structure 105 is formed includes the following operations.

A remaining portion of the first insulation layer 106 and a remaining portion of the second insulation layer 110 are completely removed.

Exposed surfaces of the plurality of first semiconductor pillars 102 and exposed surfaces of the plurality of second semiconductor pillars 104 are oxidized to form a first oxide layer 115.

A sacrificial material 117 is formed in gaps of the first oxide layer 115.

The second support layer 114 and the first oxide layer 115 are removed, so as to form a plurality of first filling areas. Each of the plurality of first semiconductor pillars 102 is surrounded by a respective one of the plurality of first filling areas, and each of the plurality of second semiconductor pillars 104 is surrounded by a respective one of the plurality of first filling area.

The plurality of first filling areas are filled with a conductive material to form a plurality of first electrodes 105-1.

The sacrificial material 117 between the plurality of first electrodes 105-1 is removed to form a plurality of second filling areas.

A dielectric layer 105-2 and a second electrode 105-3 are sequentially formed in each of the plurality of second filling areas.

In some embodiments, while the first oxide layer 115 is formed, a plurality of first portions 102-1 are completely oxidized into a plurality of oxidation pillars 122. While the sacrificial material 117 is formed in the gaps of the first oxide layer 115, the sacrificial material 117 is further formed in gaps between the plurality of oxidation pillars 122. When the sacrificial material 117 between the plurality of first electrodes 105-1 is removed, the sacrificial material 117 between the plurality of oxidation pillars 122 is remained to form a sacrificial layer 123, and the plurality of oxidation pillars 122 and the sacrificial layer 123 form a bottom support layer.

In some embodiments, before the second support layer 114 is removed, the first oxide layer 115 arranged on the sidewalls of the top portions of the plurality of second semiconductor pillars 104 is removed to form a third filling area. The sacrificial material 117 is formed in the third filling area, so as to form a third support layer 120 on the top portions of the plurality of second semiconductor pillars 104.

In some embodiments, while the plurality of first electrodes 105-1 are formed, the conductive material is formed in the plurality of third grooves and in the plurality of fourth grooves, so as to form a fourth support layer 121 on the top portions of the plurality of second semiconductor pillars 104.

Figure 15:
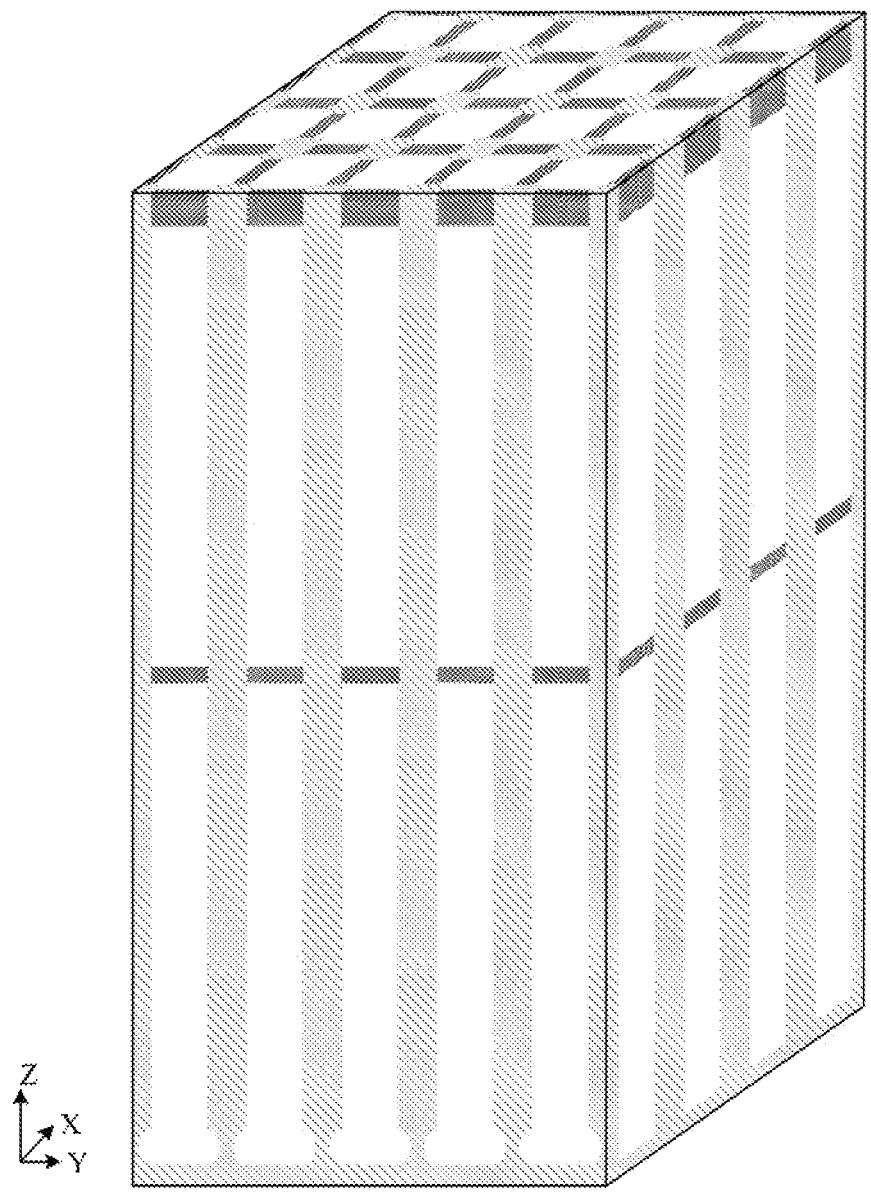

At shown in FIG. 15, a remaining portion of the first insulation layer 106 and a remaining portion of the second insulation layer 110 are completely removed.

In some specific examples, a method for completely removing the remaining portion of the first insulation layer 106 and the remaining portion of the second insulation layer 110 includes, but is not limited to, a dry etching process and a wet etching process.

Figure 16:
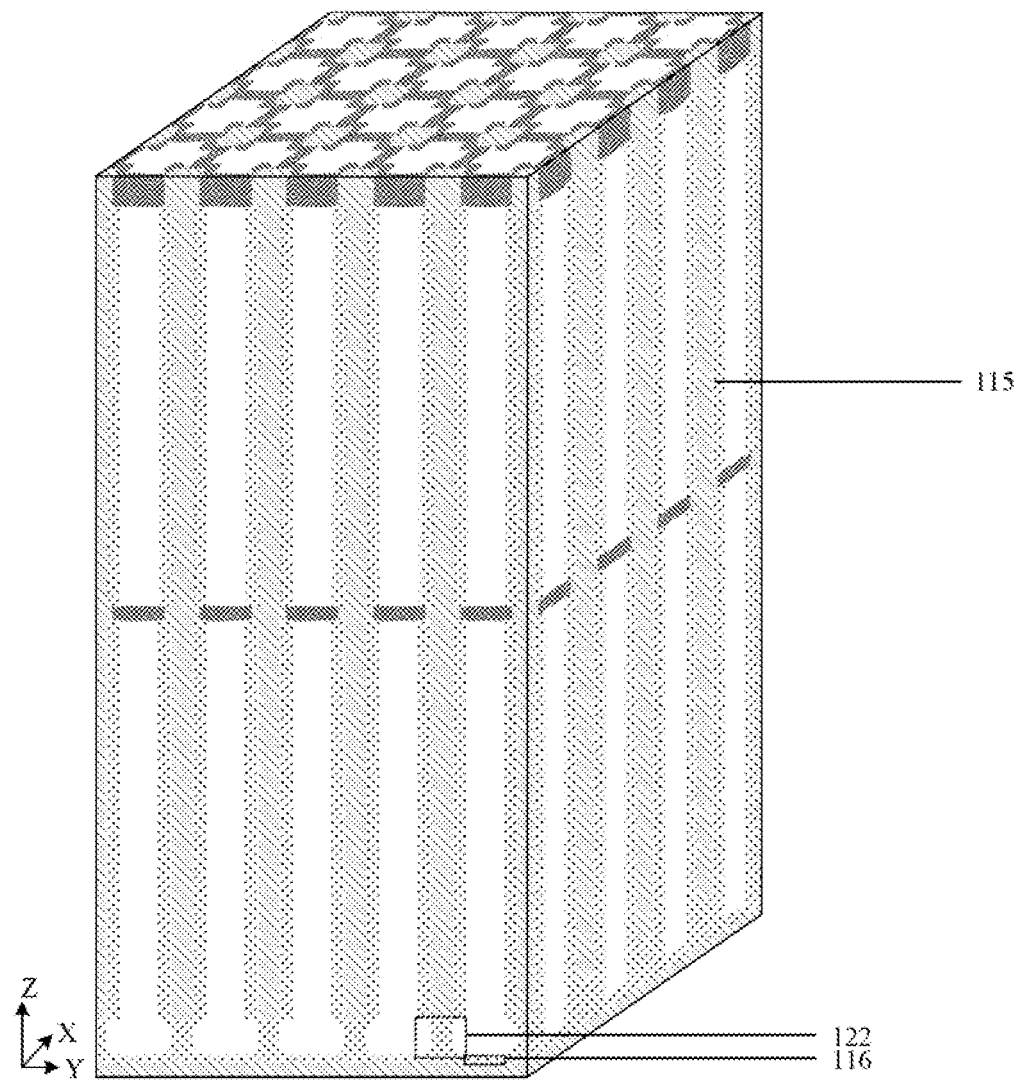

Next, as shown in FIG. 16, exposed surfaces of the plurality of first semiconductor pillars 102 and exposed surfaces of the plurality of second semiconductor pillars 104 are oxidized through an oxidation process, such as a thermal oxidation process, so that the first portions 102-1 of the plurality of first semiconductor pillars 102 are completely oxidized into the oxidation pillars 122. The exposed surfaces of the second portions 102-2 of the first semiconductor pillars 102 and the exposed surfaces of the second semiconductor pillars 104 are oxidized into a first oxide layer 115. Meanwhile, the surface of the first semiconductor base 101 is also oxidized into a second oxide layer 116.

It can be understood that, by means of the formed second oxide layer 116 and the formed oxidation pillars 122 here, the capacitor formed in the subsequent process can be isolated from the first semiconductor base 101 at the bottom portion, thereby improving the leakage problem occurring at the bottom portion of the capacitor.

Here, materials of the first oxide layer 115, the second oxide layer 116, and the oxidation pillar 122 are the same. Exemplarily, the constituent materials of the first oxide layer 115, the second oxide layer 116, and the oxidation pillar 122 include, but are not limited to, silicon oxide.

In some specific examples, the materials of the first oxide layer 115, the second oxide layer 116, and the oxidation pillar 122 here are the same as or different from the material of the first insulation layer 106. The materials of the first oxide layer 115, the second oxide layer 116, and the oxidation pillar 122 are the same as or different from the material of the second insulation layer 110.

In order to illustrate the changes of the top portion of the first semiconductor pillar 102 in the process more clearly, FIG. 17, FIG. 19, FIG. 23 and FIG. 25 independently show schematic cross-sectional views of the top portion of the first semiconductor pillar 102.

Figure 17:
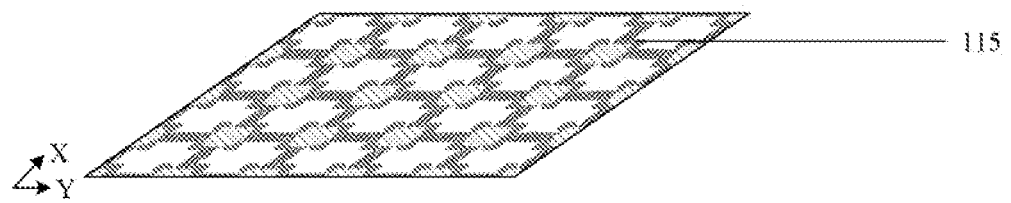

As shown in FIG. 16 and FIG. 17, during the oxidation of the first semiconductor pillars 102 and the second semiconductor pillars 104, since the portion of the sidewall of the top portion of each of the first semiconductor pillars 102 and the portion of the sidewall of the top portion of each of the second semiconductor pillars 104 are covered by the first support layer 109 and the second support layer 114, on the top portions of the first semiconductor pillars 102 and the top portions of the second semiconductor pillars 104, only the uncovered portion of the sidewall of each of the first semiconductor pillars 102 and the uncovered portion of the sidewall of each of the second semiconductor pillars 104 are oxidized into the first oxide layer 115.

It should be noted that, after the first trenches 118 and/or the second trenches 119 are expanded in the foregoing embodiments, the size of the first portion 102-1 of the first semiconductor pillar 102 are relatively small, which is easily to completely oxidized. In addition, when the first portion 102-1 of the first semiconductor pillar 102 is oxidized, only the surface of the second portion 102-2 of the first semiconductor pillar 102 is oxidized.

Figure 18:
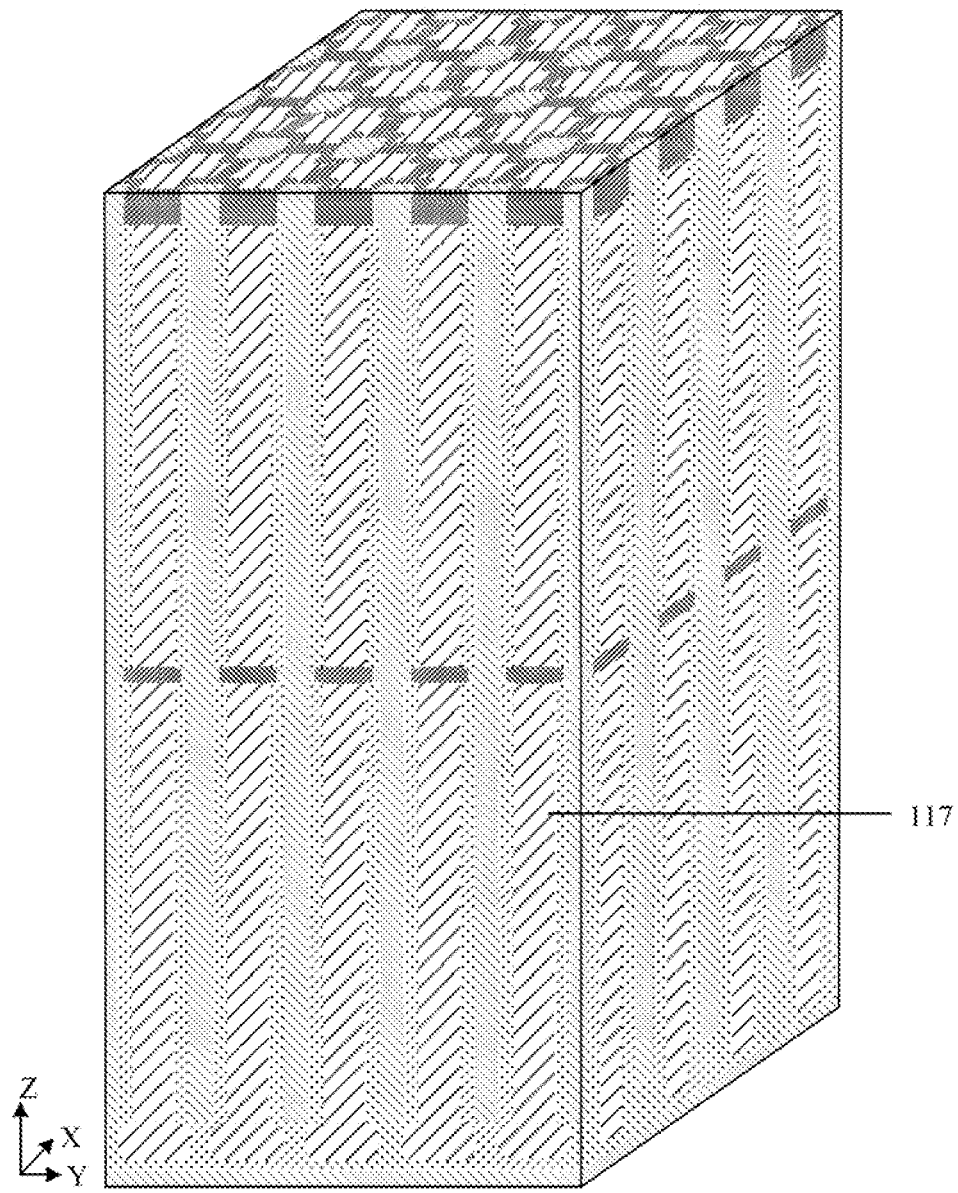
Figure 19:
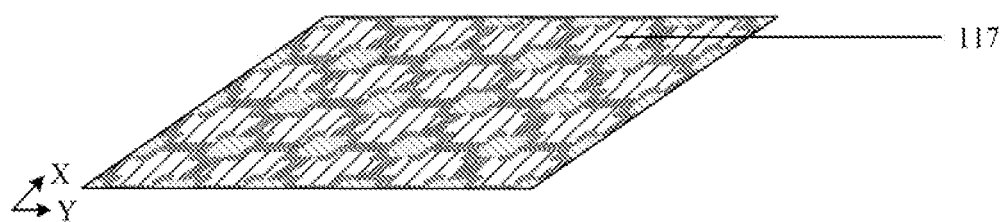

Next, as shown in FIG. 18 and FIG. 19, a sacrificial material 117 is formed in gaps of the first oxide layer 115 and in gaps between the plurality of oxidation pillars 122.

In some specific examples, a method for forming the sacrificial material 117 includes, but is not limited to, a PVD process, a CVD process, and an ALD process.

In some specific examples, a material for forming the sacrificial material 117 includes, but is not limited to, polycrystalline silicon and carbon.

Here, for the selection of the material of the sacrificial material 117, in the first aspect, it should be considered that the sacrificial material 117 has a certain etching selectivity ratio relative to the first oxide layer 115, so that the sacrificial material 117 may be remained when the first oxide layer 115 is removed in the subsequent process. In the second aspect, it should be considered that the sacrificial material 117 has a certain etching selectivity ratio relative to the material of the first electrode 105-1 formed in the subsequent process, so that the impact of the formed first electrode 105-1 is reduced when the sacrificial layer 123 is formed by removing the sacrificial material 117 in the subsequent process. In the third aspect, the sacrificial material 117 should be conveniently removed in the subsequent process.

Figure 20:
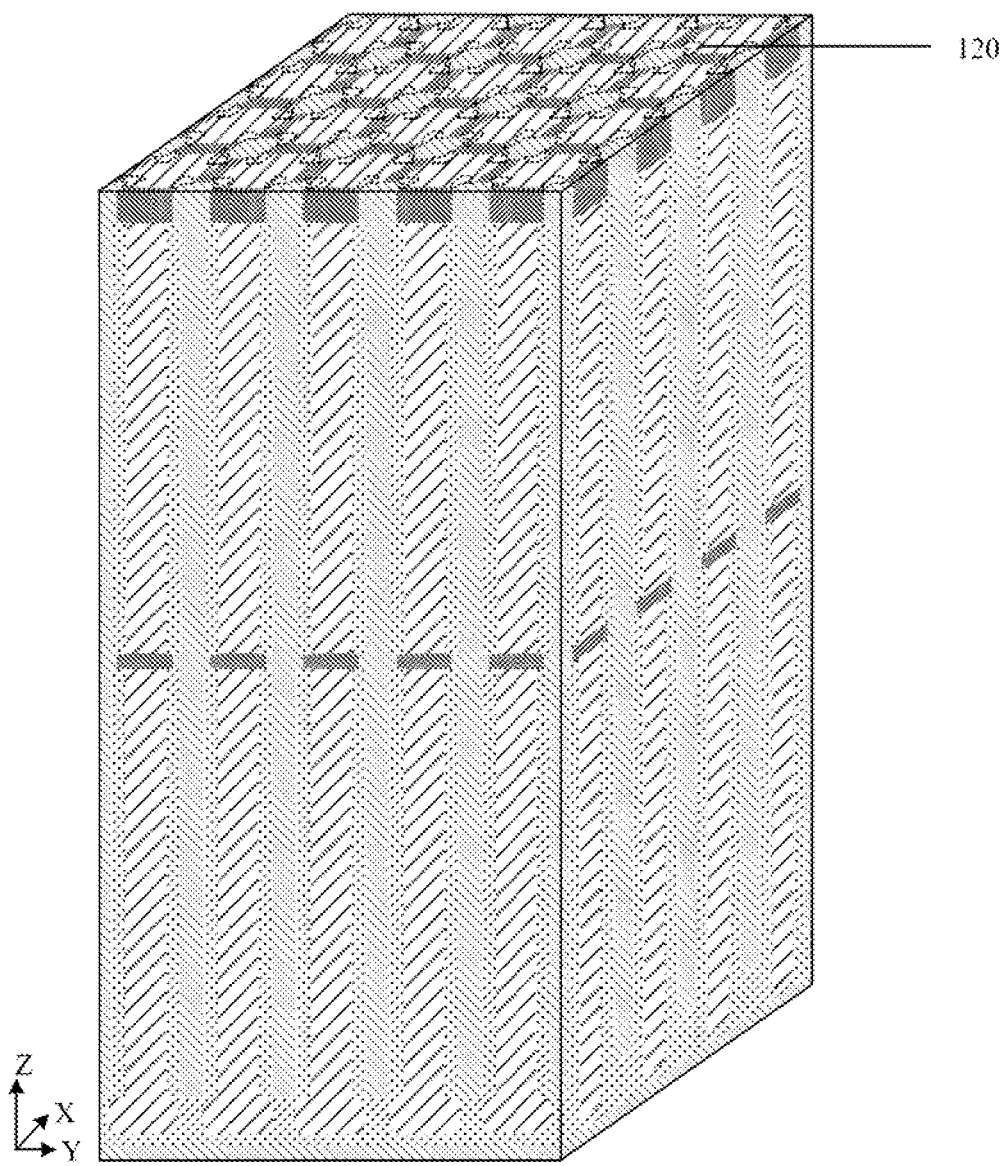

Next, as shown in FIG. 20, the first oxide layer 115 arranged on the sidewalls of the top portions of the plurality of second semiconductor pillars 104 is removed to form a third filling area. The sacrificial material 117 is formed in the third filling area, so as to form a third support layer 120 on the top portions of the plurality of second semiconductor pillars 104. The third support layer 120 may specifically be the sacrificial material in a dashed box shown in FIG. 20, and specifically be the sacrificial material in an area arranged around four corners of the second semiconductor pillar shown in FIG. 20.

In some specific examples, a method for removing the first oxide layer 115 arranged on the sidewalls of the top portions of the second semiconductor pillars 104 includes, but is not limited to, a dry etching process and a wet etching process.

In some specific examples, a method for forming the sacrificial material 117 in the third filling area includes, but is not limited to, a PVD process, a CVD process, and an ALD process.

It should be noted that, when the first oxide layer 115 arranged on the sidewalls of the top portions of the second semiconductor pillars 104 is removed, the first oxide layer 115 on the sidewalls of the top portions of the first semiconductor pillars 102 is not removed.

It can be understood that, if the first oxide layer 115 arranged on the sidewalls of the top portions of the second semiconductor pillars 104 is not firstly removed to form the third support layer 120, but the whole first oxide layer 115 is directly removed together, the sacrificial material 117 formed in the gaps between the second semiconductor pillars 104 in the foregoing embodiments is separated from the top portions of the second semiconductor pillars 104 after the first oxide layer 115 is completely removed, and the plurality of second semiconductor pillars 104 will lose support after the second support layer 114 is removed in the subsequent process, resulting in a risk of collapse. Therefore, the collapse problem may be further improved by firstly forming the third support layer 120 as a top support.

Figure 21:
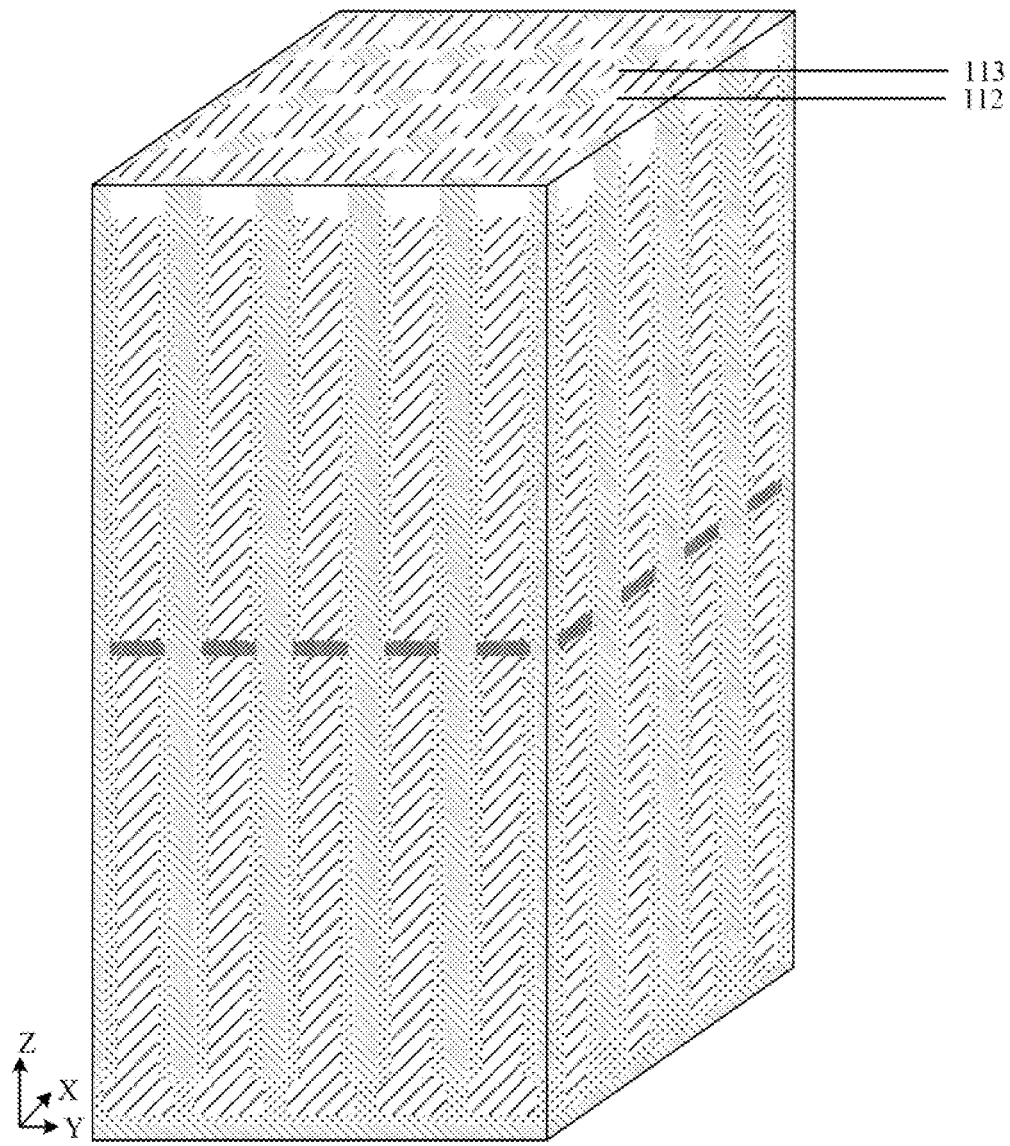

Next, as shown in FIG. 21, the second support layer 114 is removed to form a plurality of third grooves 112 and a plurality of fourth grooves 113.

Here, a method for removing the second support layer 114 includes, but is not limited to, a dry etching process and a wet etching process.

Figure 22:
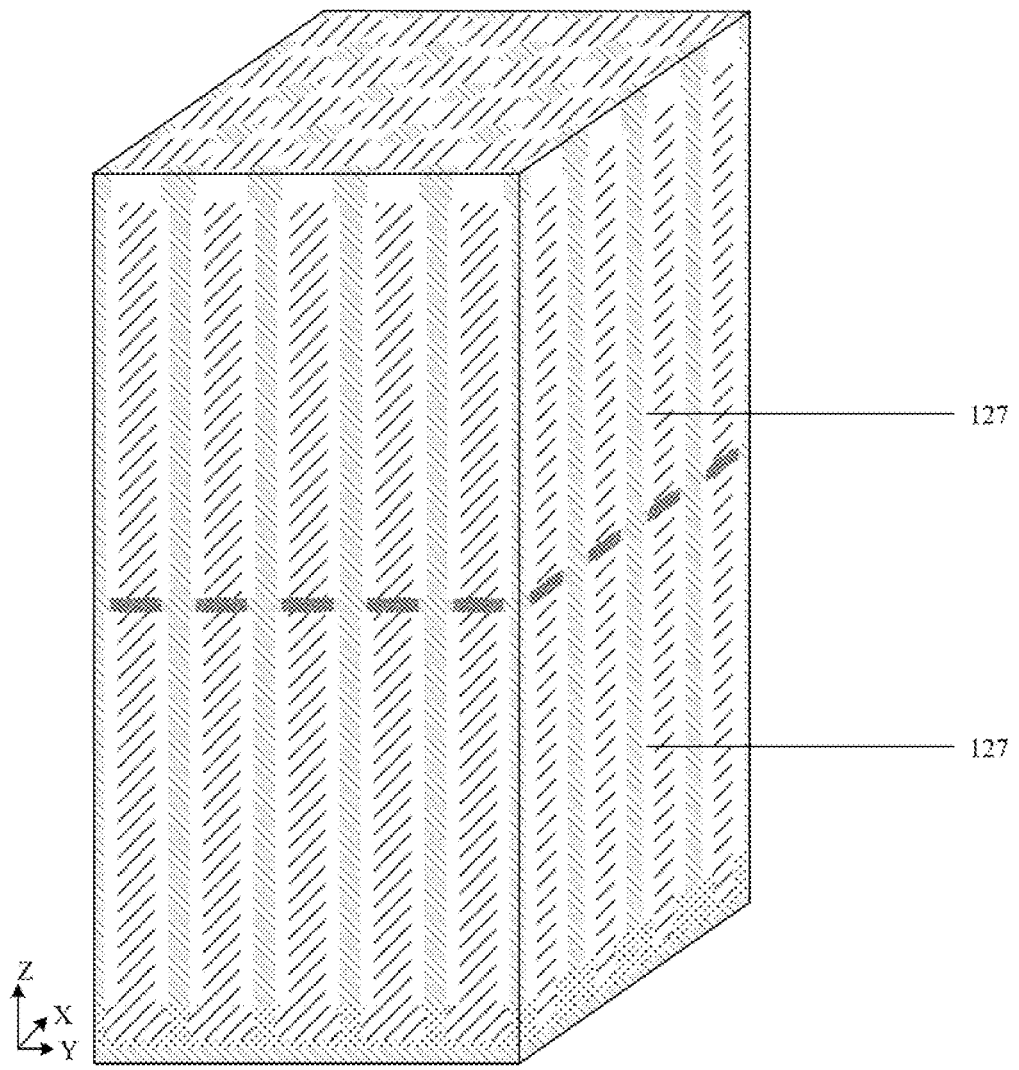
Figure 23:
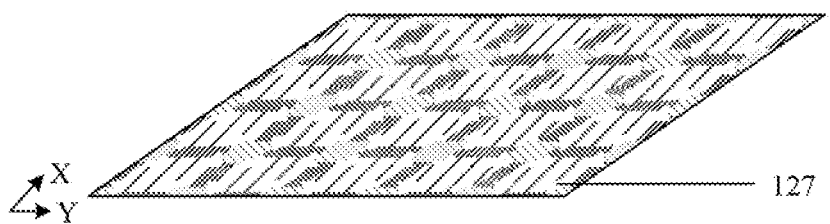

Next, as shown in FIG. 22 and FIG. 23, a remaining portion of the first oxide layer 115 in the gaps between the first semiconductor pillars 102 and the gaps between the second semiconductor pillars 104 is removed.

Here, after the second support layer 114, and the remaining portion of the first oxide layer 115 in the gaps between the first semiconductor pillars 102 and the gaps between the second semiconductor pillars 104 are removed, a plurality of first filling areas 127 arranged around the first semiconductor pillars 102 and the second semiconductor pillars 104 are formed. The area arranged around the four corners of the first semiconductor pillar on the top portion of the first semiconductor pillar shown in FIG. 23 is also a portion of the first filling area 127.

In some specific examples, a method for removing the remaining portion of the first oxide layers 115 includes, but is not limited to, a dry etching process and a wet etching process.

Figure 24:
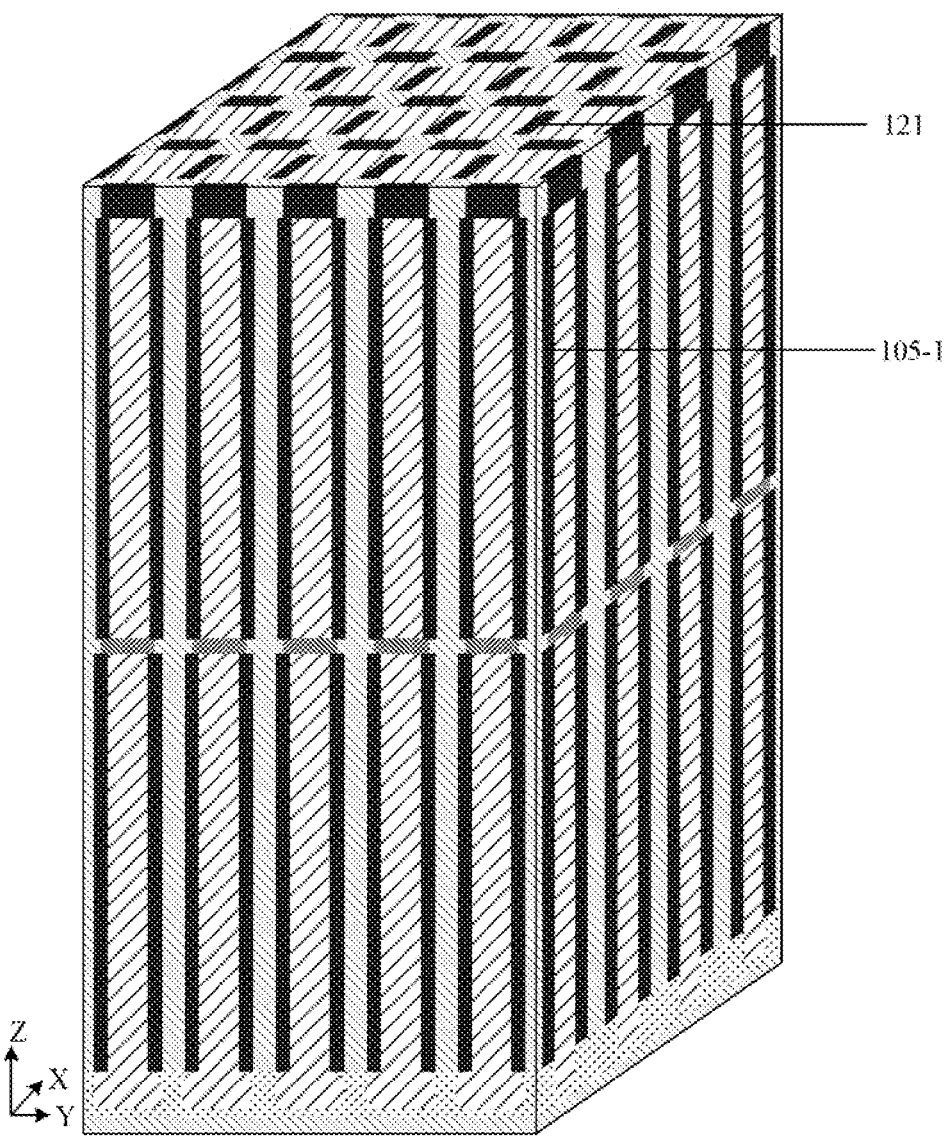
Figure 25:
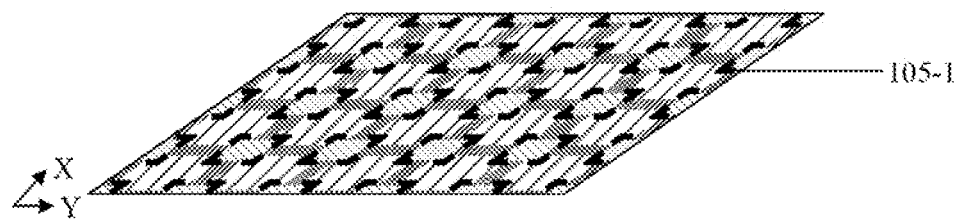

Next, as shown in FIG. 24 and FIG. 25, the plurality of first filling areas 127 are filled with a conductive material, so as to form a plurality of first electrodes 105-1. Specifically, the conductive material may be filled in the third grooves 112, the fourth grooves 113, the gaps between the first semiconductor pillars 102, and the gaps between the portions of the second semiconductor pillars 104 except the top portions of the second semiconductor pillars. The conductive material filled in the third grooves 112 and the fourth grooves 113 forms a fourth support layer 121. The conductive material filled in the gaps between the first semiconductor pillars 102 and the gaps between the portions of the second semiconductor pillars 104 except the top portions of the second semiconductor pillars forms the first electrodes 105-1. The first filling areas 127 arranged around the four corners of the first semiconductor pillar on the top portion of the first semiconductor pillar shown in FIG. 25 also forms with the first electrodes 105-1.

It can be understood that, the formed fourth support layer 121 may be configured for supporting, thereby improving the collapse problem caused by lose of support of the first semiconductor pillars 102 and the second semiconductor pillars 104 after the sacrificial material 117 is removed in the subsequent process.

Here, the first electrode 105-1 is used as a lower electrode of the capacitor.

In some specific examples, the constituent material of the first electrode 105-1 may include, but is not limited to, ruthenium (Ru), ruthenium oxide (RuO), and titanium nitride (TiN).

In some specific examples, a method for forming the first electrode 105-1 includes, but is not limited to, a PVD process, a CVD process, and an ALD process.

It can be understood that, in the embodiments of the disclosure, the first filling areas 127 are formed after the first oxide layer 115 is removed. In this case, the first filling areas 127 are arranged around the first semiconductor pillars 102 and the second semiconductor pillars 104. The material for forming the first electrodes 105-1 is directly filled into the first filling areas 127 to form the first electrodes 105-1. The plurality of formed first electrodes 105-1 are separated from each other. The conventional method includes the following operations. The material of the first electrodes 105-1 is directly deposited in the first trenches 118 and the second trenches 119 in the gaps between the first semiconductor pillars 102 to form a plurality of first electrodes 105-1. In this way, bottom portions of the plurality of first electrodes 105-1 cannot be separated from each other, so that the first electrodes 105-1 interfere with each other. However, the first electrodes 105-1 formed in the solution in the embodiments of the disclosure can be separated from each other, so that the problem of mutual interference between the plurality of first electrodes 105-1 can be improved.

Figure 26:
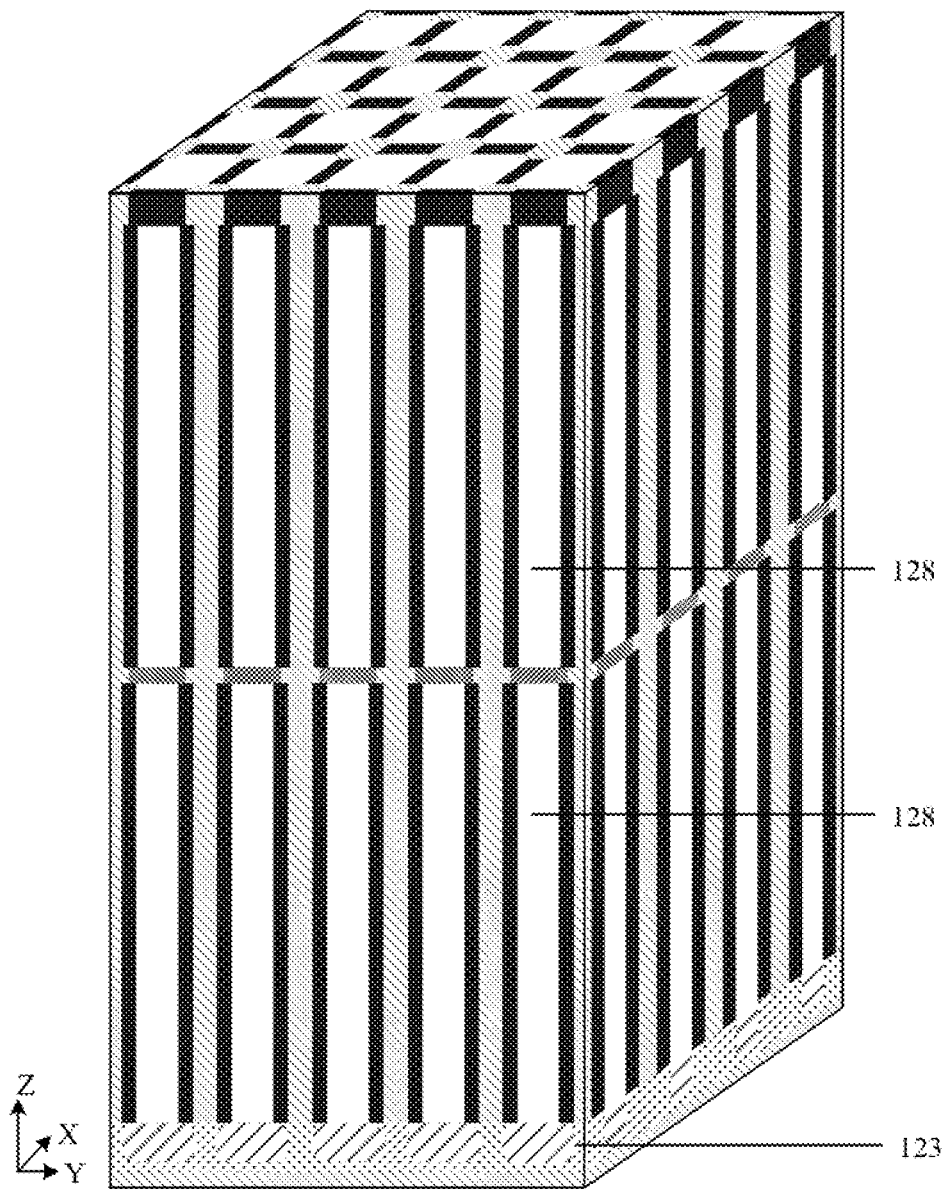

Next, as shown in FIG. 26, the sacrificial material 117 between the plurality of first electrodes 105-1 is removed, so as to form a plurality of second filling areas 128. When the sacrificial material 117 between the plurality of first electrodes 105-1 is removed, the sacrificial material 117 between the oxidation pillars 122 is remained to form a sacrificial layer 123. The oxidation pillars 122 and the sacrificial layer 123 form a bottom support layer. In addition, when the sacrificial material 117 between the first electrodes 105-1 is removed, the sacrificial material 117 in the fourth support layer 121 is simultaneously removed.

In some specific examples, a method for removing the sacrificial material 117 includes, but is not limited to, a wet etching process and a dry etching process. Exemplarily, when the sacrificial material 117 between the first electrodes 105-1 is removed through an etching process, by controlling the etching time, only the sacrificial material 117 between the first electrodes 105-1 and in the fourth support layer 121 is etched, and the sacrificial material 117 in the gaps between the oxidation pillars 122 is remained.

Figure 27:
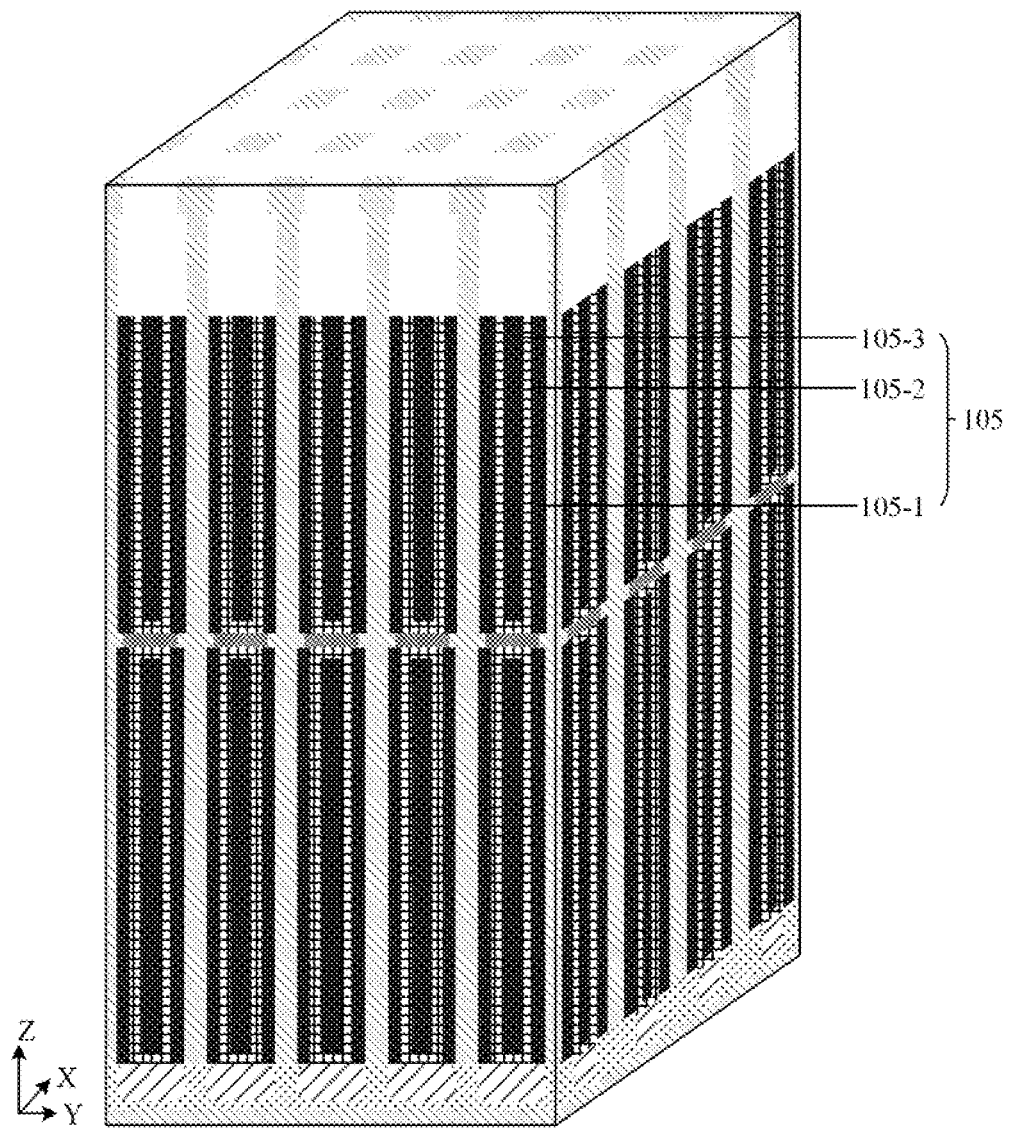

Next, as shown in FIG. 27, a dielectric layer 105-2 and a second electrode 105-3 are sequentially formed in each of the plurality of second filling areas 128.

Here, the dielectric layer 105-2 is used as a dielectric medium of the capacitor.

Here, a constituent material of the dielectric layer 105-2 includes a high dielectric constant (High-K) material. The High-K material generally refers to a material with a dielectric constant higher than 3.9, and is generally significantly higher than this value. In some specific examples, a material of the dielectric layer 105-2 may include, but is not limited to, alumina ($Al_2O_3$), zirconium oxide (ZrO), hafnium oxide ($HfO_2$), strontium titanate ($SrTiO_3$), etc.

In some specific examples, the constituent material of the second electrode 105-3 may include, but is not limited to, Ru, RuO, and TiN.

Here, a method for forming the second electrode 105-3 includes, but is not limited to, a process such as a PVD process, a CVD process, etc.

It can be understood that, in the embodiments of the disclosure, the semiconductor pillars are formed in two operations. That is, the first semiconductor pillars 102 are firstly formed, and then the second semiconductor pillars 104 are formed. Then the storage structure 105 is formed in the gaps between the first semiconductor pillars 102 and the gaps between the second semiconductor pillars after the first semiconductor pillars 102 and the second semiconductor pillars 104 are formed, so that the collapse problem due to the higher semiconductor pillars formed in one operation can be improved.

The above introduces that the semiconductor pillars are formed in two operations. In some specific examples, the semiconductor pillars may also be formed in three or more operations. In the actual application, the specific number of the operations may be selected according to a balance of saving process time and improving collapse problem.

In some embodiments, the method further includes the following operation. Before the second semiconductor base 103 is formed, a third semiconductor base is formed on the first semiconductor pillars 102 and the first support layer 109.

A portion of the third semiconductor base is removed to form a third active layer. The third active layer includes a plurality of third semiconductor pillars. Each third semiconductor pillar is arranged on a top surface of a respective one of the plurality of first semiconductor pillars 102.

A fifth support layer is formed on a top portion of the third active layer. The fifth support layer covers sidewalls of top portions of the plurality of third semiconductor pillars.

The operation that the storage structure 105 is formed on the sidewalls of the plurality of first semiconductor pillars 102 and on the sidewalls of the plurality of second semiconductor pillars 104 includes the following operation.

The storage structure 105 is formed on the sidewalls of the plurality of first semiconductor pillars 102, the sidewalls of the plurality of second semiconductor pillars 104, and the sidewalls of the plurality of third semiconductor pillars.

Next, a transistor is formed on sidewalls of upper portions of the second semiconductor pillars 104. A bit line electrically connected to one of a source and a drain of the transistor is formed. The capacitor in the semiconductor structure is electrically connected to the other one of the source and the drain of the transistor.

In some embodiments, the method further includes the following operations.

The fourth support layer 121 and a portion of the storage structure 105 arranged on the upper portions of the plurality of second semiconductor pillars 104 are removed to expose the sidewalls of the upper portions of the plurality of second semiconductor pillars 104.

A gate structure 124 is formed on at least one side of a portion of the sidewall of the upper portion of each of the plurality of second semiconductor pillars.

As shown in FIG. 27, the fourth support layer 121 and the portion of the storage structure 105 arranged on the upper portions of the plurality of second semiconductor pillars 104 are removed, so as to expose the sidewalls of the upper portions of the plurality of second semiconductor pillars 104.

In some specific examples, a method for removing the fourth support layer 121 and the portion of the storage structure 105 arranged on the upper portions of the second semiconductor pillars 104 includes, but is not limited to, a dry etching process and a wet etching process.

Figure 28:
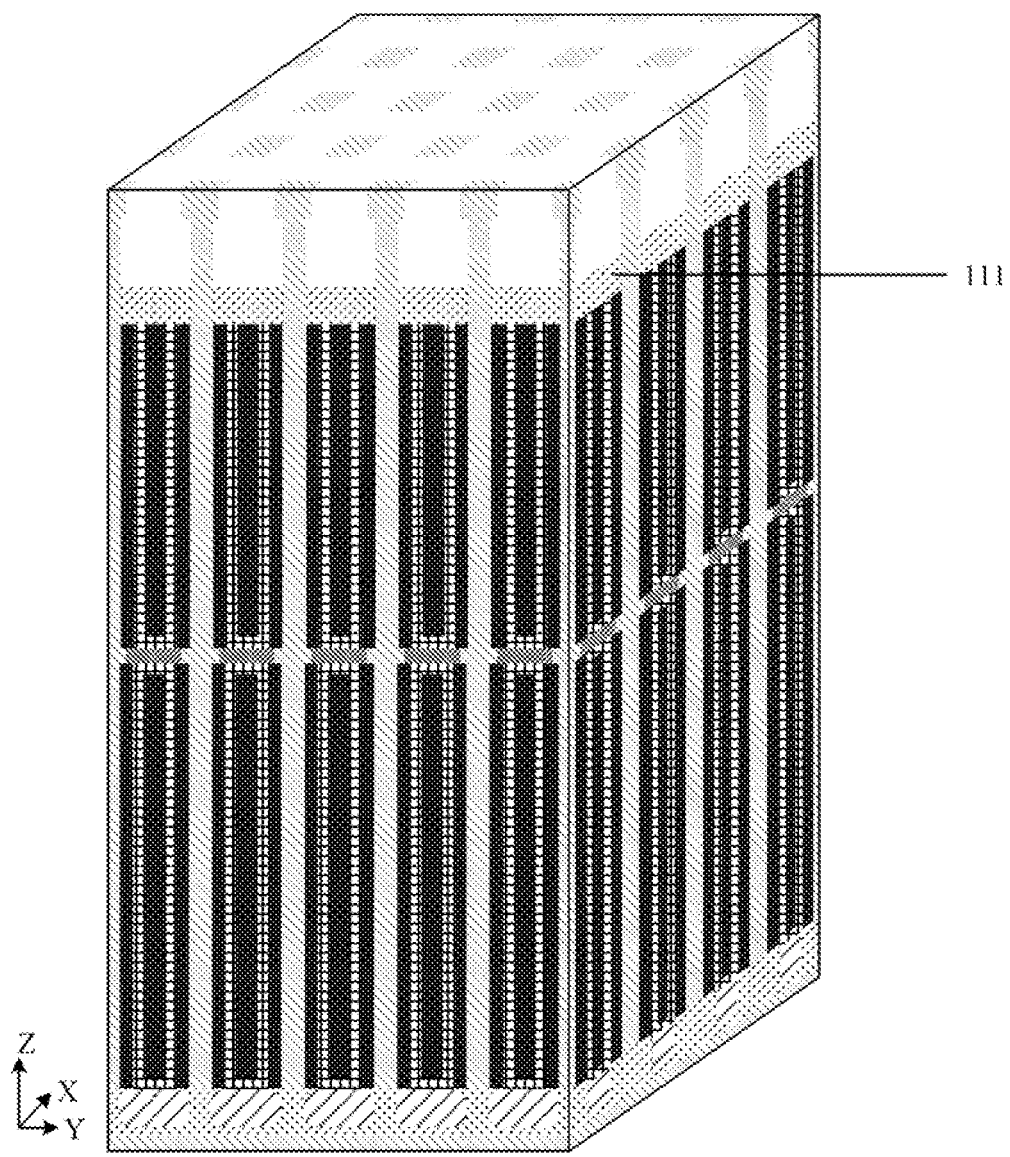

As shown in FIG. 28, a third insulation layer 111 is formed between the second semiconductor pillars 104 of which the sidewalls are exposed. A height of the third insulation layer 111 in the third direction is lower than a height of the second semiconductor pillar 104 in the third direction.

Figure 29:
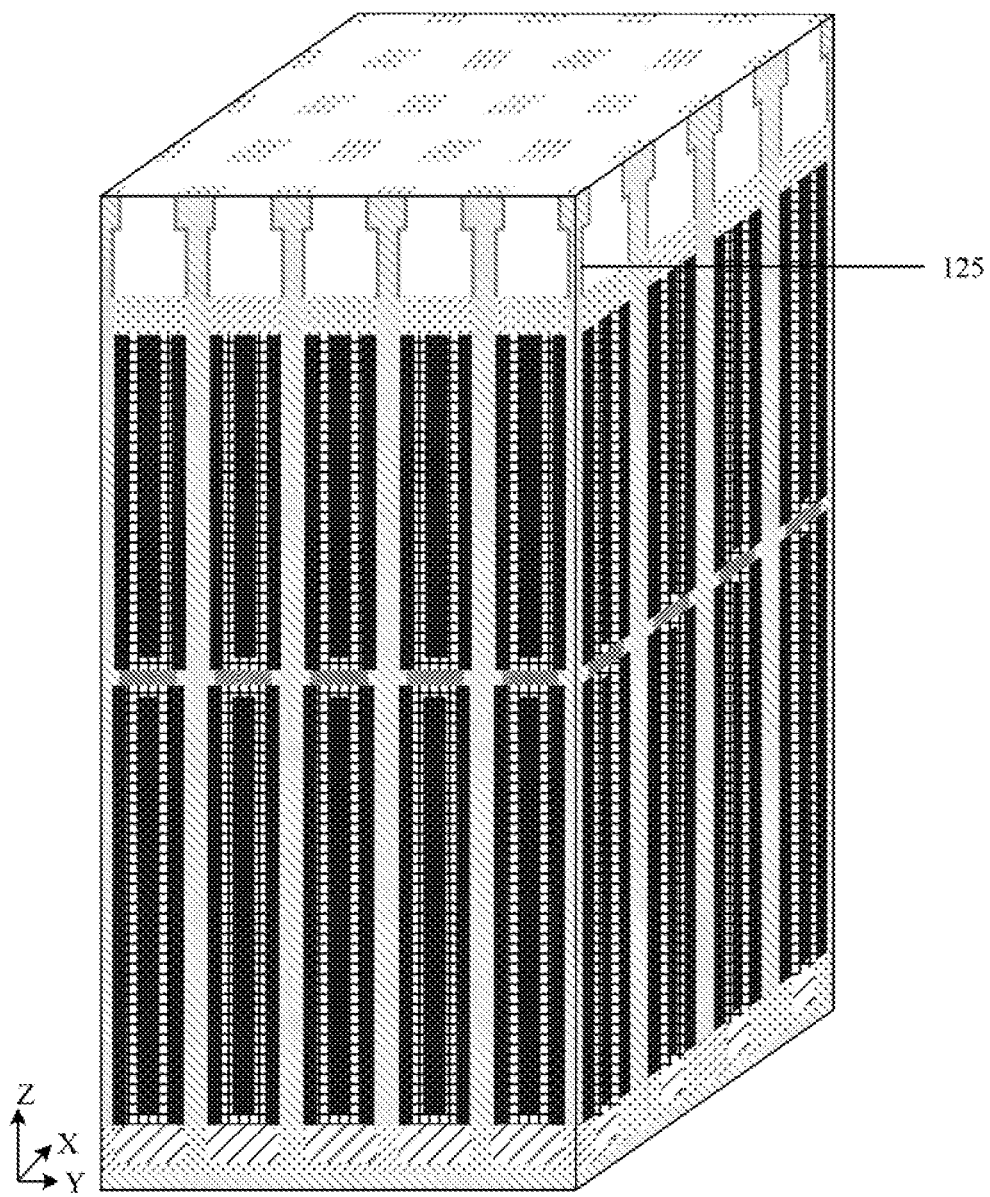
Figure 30:
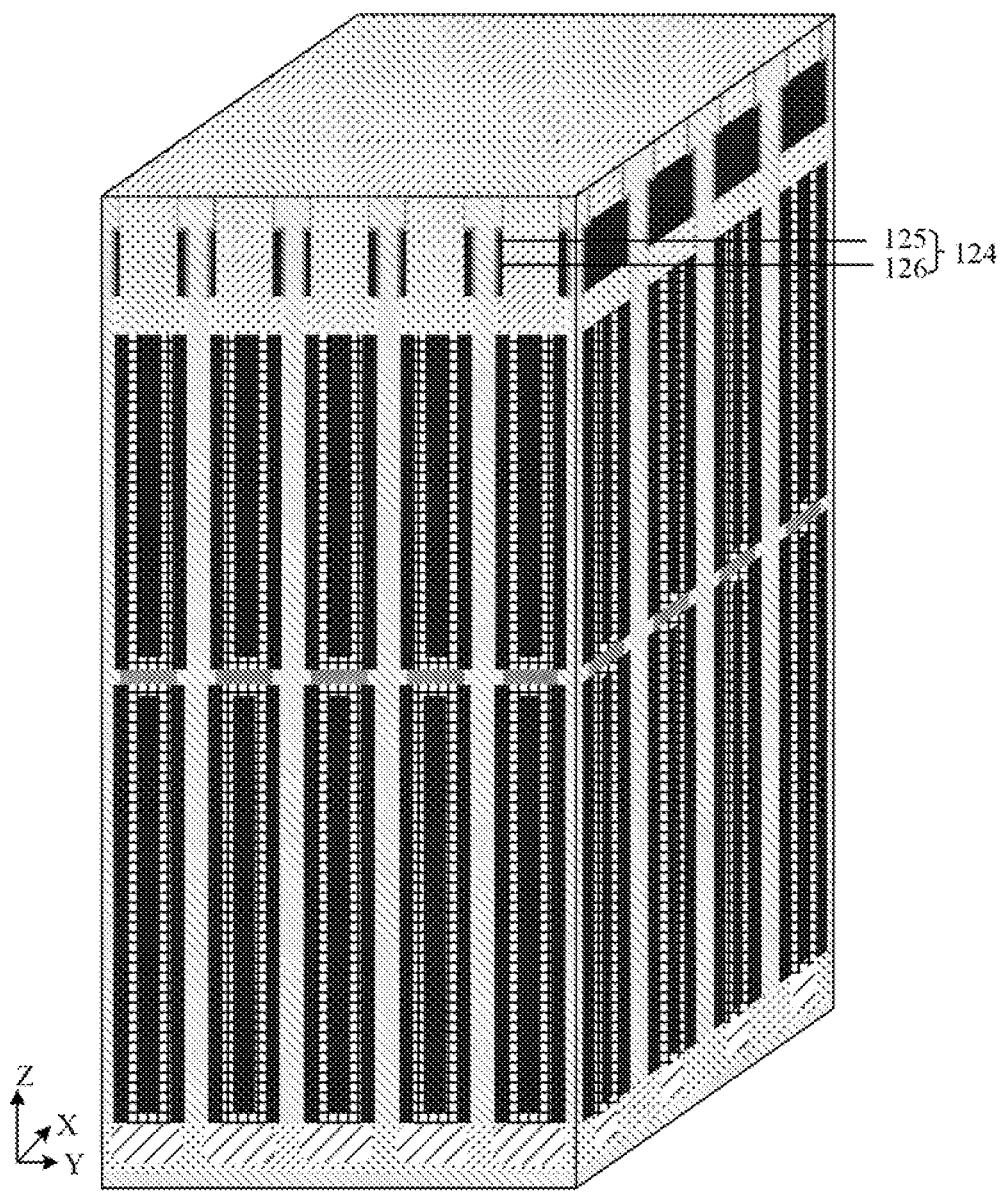

As shown in FIG. 29 and FIG. 30, a gate oxide layer 125 and a gate (G) 126 are formed on the exposed sidewall of the second semiconductor pillar 104.

Here, in different types of transistors, the shapes of the gates 126 are different. Exemplarily, in a pillar gate transistor, the gate 126 is formed on one side of a channel area in the form of a pillar. In a gate semi-around transistor, the gate 126 surrounds a half of the channel area. In a Gate All Around (GAA) transistor, the gate 126 completely surrounds the channel area.

In the embodiments of the disclosure, the types of the transistor may include the above various types, which are not limited thereto. Preferably, the type of the transistor is the GAA transistor.

It should be noted that, the gate structure 124 here includes the gate 126 and the gate oxide layer. The gate oxide layer is arranged between the gate 126 and the channel area, and is configured to electrically isolate the channel area from the gate 126, so as to reduce the hot carrier effect of the transistor.

Here, a material of the gate 126 may include metal, polycrystalline silicon (Poly), etc. A material of the gate oxide layer may include, but is not limited to, silicon oxide.

In some specific examples, a method for forming the gate 126 includes, but is not limited to, a PVD process, a CVD process, an ALD process, etc. A method for forming the gate oxide layer includes, but is not limited to, an in-situ oxidation process.

In some specific examples, the method further includes the following operation. A source is formed at one end of the upper portion of the respective second semiconductor pillar 104, and a drain is formed on another end, which is opposite to said one end in the third direction, of the upper portion of the respective second semiconductor pillar 104. The method for forming the source and the drain includes, but is not limited to, a doping process, a diffusion process, etc.

It should be noted that, positions of the source and the drain on two opposite ends of the upper portion of the respective second semiconductor pillar 104 may be interchanged. In the actual situation, the positions may be selected according to actual needs.

In some embodiments, the method further includes the following operation.

A plurality of bit lines are formed on the second semiconductor pillar 104. The plurality of bit lines are in electric contact with the top portion of the second semiconductor pillar 104.

It can be understood that, the memory in the above embodiment is a Transistor on Capacitor (TOC) structure. This structure further includes the plurality of bit lines arranged on the transistor and in electric contact with the top portion of the second semiconductor pillar 104.

It can be understood that, the bit line is configured to perform a read or write operation on the transistor when the transistor is turned on.

Here, the bit line is disposed above the transistor and is used as a Metal BL, so that the resistance and the process difficulty may be reduced, which better matches with the circuit design of the memory.

The embodiments of the disclosure provide a method for manufacturing a semiconductor structure, which includes the following operations. A first semiconductor base 101 is provided, and a first active layer is formed on the first semiconductor base 101, in which the first active layer includes a plurality of first semiconductor pillars 102 arranged in an array in a first direction and in a second direction, each of the first direction and the second direction is perpendicular to an extending direction of each of the plurality of first semiconductor pillars 102, and the first direction intersects with the second direction. A first support layer 109 is formed on a top portion of the first active layer. A second semiconductor base 103 is formed on the first active layer and the first support layer 109. A portion of the second semiconductor base 103 is removed to form a second active layer, in which the second active layer includes a plurality of second semiconductor pillars 104, and each of the plurality of second semiconductor pillars 104 is arranged on a top surface of a respective one of the plurality of first semiconductor pillars 102. A second support layer 114 is formed on a top portion of the second active layer. A storage structure 105 is formed on sidewalls of the plurality of first semiconductor pillars 102 and on sidewalls of the plurality of second semiconductor pillars 104. In the embodiments of the disclosure, the plurality of first semiconductor pillars are firstly formed on the first semiconductor base, and the first support layer is formed on the top portions of the plurality of first semiconductor pillars, and then the plurality of second semiconductor pillars are formed on the plurality of first semiconductor pillars, and the second support layer is formed on the top portions of the plurality of second semiconductor pillars, so that the storage structure with larger storage capacity can be formed in the gaps between the semiconductor pillars with a higher height. Meanwhile, the first support layer and the second support layer can support the first semiconductor pillars and the second semiconductor pillars, so that the semiconductor pillars with a higher height can be formed without collapsing, thereby obtaining a semiconductor structure with high capacity and high strength.

According to another aspect of the disclosure, an embodiment of the disclosure further provides a semiconductor structure, which includes: a plurality of first semiconductor pillars, a plurality of second semiconductor pillars, a first support layer, and a storage structure.

The plurality of first semiconductor pillars are arranged in an array in a first direction and in a second direction. Each of the first direction and the second direction is perpendicular to an extending direction of each of the plurality of first semiconductor pillars, and the first direction intersects with the second direction.

The first support layer covers sidewalls of top portions of the plurality of first semiconductor pillars.

Each of the plurality of second semiconductor pillars is arranged on a respective one of the plurality of first semiconductor pillars. The storage structure is arranged around at least sidewalls of the plurality of first semiconductor pillars and sidewalls of the plurality of second semiconductor pillars.

In some embodiments, the first support layer includes a plurality of first support pillars and a plurality of second support pillars.

Each of the plurality of first support pillars is arranged between the top portions of two first semiconductor pillars adjacent to each other in the second direction. Each of the plurality of second support pillars is arranged between the top portions of two first semiconductor pillars adjacent to each other in the first direction. The first support layer covers a portion of the sidewall of the top portion of each of the plurality of first semiconductor pillars.

In some embodiments, the storage structure includes:
a plurality of first electrodes, in which each of the plurality of first electrodes covers at least a portion of the sidewall of a respective one of the plurality of first semiconductor pillars which is uncovered by the first support layer, and covers the sidewall of a respective one of the plurality of second semiconductor pillars;
a plurality of dielectric layers, in which each of the plurality of dielectric layers covers at least a sidewall of a respective one of the plurality of first electrodes, a sidewall of a respective one of the plurality of first support pillars, and a sidewall of a respective one of the plurality of second support pillars; and
a plurality of second electrodes arranged in gaps between the plurality of first semiconductor pillars and in gaps between the plurality of second semiconductor pillars, in which each of the plurality of second electrodes covers a respective one of the plurality of dielectric layers.

In some embodiments, the semiconductor structure further includes:
a plurality of oxidation pillars, in which each of the plurality of first semiconductor pillars is arranged on a top surface of a respective one of the plurality of oxidation pillars; and
a sacrificial layer arranged in gaps between the plurality of oxidation pillars.

The plurality of dielectric layers also cover a top surface of the sacrificial layer.

In some embodiments, the semiconductor structure further includes:
a plurality of transistors, in which a channel structure of each of the plurality of transistors is arranged on an upper portion of a respective one of the plurality of second semiconductor pillars, and an extending direction of the channel structure is perpendicular to a plane where the first direction and the second direction are located.

Each of the plurality of transistors includes:
a gate structure arranged around at least a portion of a sidewall of the upper portion of the respective one of the plurality of second semiconductor pillars; a source arranged on the upper portion of the respective one of the plurality of second semiconductor pillars and arranged at one end of the channel structure; and a drain arranged on the upper portion of the respective one of the plurality of second semiconductor pillars and arranged at another end of the channel structure.

In some embodiments, the semiconductor structure further includes a plurality of third semiconductor pillars and a fifth support layer.

Each third semiconductor pillar is arranged on a respective one of the plurality of first semiconductor pillars. Each second semiconductor pillar is arranged on a respective one of the plurality of third semiconductor pillars.

The fifth support layer covers sidewalls of top portions of the plurality of third semiconductor pillars.

The storage structure is further arranged around the sidewalls of the plurality of third semiconductor pillars.

According to still another aspect of the disclosure, an embodiment of the disclosure further provides a memory, which includes one or more semiconductor structures described in any one of the above embodiments of the disclosure.

The semiconductor structure and memory provided in the above embodiments have been described in detail on the method side, which is not repeated herein.

In several embodiments provided in the disclosure, it should be understood that the disclosed device and method may be implemented in non-target manners. The described device embodiments are merely exemplary. For example, the unit division is merely logical function division and may be other division in an actual implementation. For example, a plurality of units or components may be combined or integrated into another system, or some features may be ignored or not performed. In addition, the displayed or discussed components may be coupled or directly coupled to each other.

The features disclosed in several method or device embodiments provided in the disclosure can be combined arbitrarily without conflict to obtain a new method embodiment or device embodiment.

The above is merely specific implementations of the disclosure, and is not intended to limit the protection scope of the disclosure. It is easy for those skilled in the art to convince modifications or substitutions within the technical scope disclosed in the disclosure. These modifications or substitutions are within the protection scope of the disclosure. Therefore, the protection scope of the disclosure is subject to the protection scope of the claims.

What is claimed is:

1. A semiconductor structure, comprising: a plurality of first semiconductor pillars, a plurality of second semiconductor pillars, a first support layer, a storage structure, and a plurality of transistors,
   wherein the plurality of first semiconductor pillars are arranged in an array in a first direction and in a second direction, each of the first direction and the second direction is perpendicular to an extending direction of each of the plurality of first semiconductor pillars, and the first direction intersects with the second direction;
   wherein the first support layer covers sidewalls of top portions of the plurality of first semiconductor pillars;
   wherein each of the plurality of second semiconductor pillars is arranged on and in contact with a respective one of the plurality of first semiconductor pillars, and the storage structure is arranged around sidewalls of the plurality of first semiconductor pillars and sidewalls of lower portions of the plurality of second semiconductor pillars; and
   wherein a channel structure of each of the plurality of transistors arranged in an upper portion of a respective one of the plurality of second semiconductor pillars, and an extending direction of the channel structure is perpendicular to a plane where the first direction and the second direction are located,
   wherein each of the plurality of transistors comprises:
   a gate structure arranged around a portion of a sidewall of the upper portion of the respective one of the plurality of second semiconductor pillars;
   a source arranged in the upper portion of the respective one of the plurality of second semiconductor pillars and arranged at one end of the channel structure; and
   a drain arranged in the upper portion of the respective one of the plurality of second semiconductor pillars that arranged at another end of the channel structure.

2. The semiconductor structure according to claim 1, wherein the first support layer comprises a plurality of first support pillars and a plurality of second support pillars,
   wherein each of the plurality of first support pillars is arranged between the top portions of two first semiconductor pillars adjacent to each other in the second direction, each of the plurality of second support pillars is arranged between the top portions of two first semiconductor pillars adjacent to each other in the first direction, and the first support layer covers a portion of the sidewall of the top portion of each of the plurality of first semiconductor pillars.

3. The semiconductor structure according to claim 2, wherein the storage structure comprises:
   a plurality of first electrodes, wherein each of the plurality of first electrodes covers at least a portion of the sidewall of a respective one of the plurality of first semiconductor pillars which is uncovered by the first support layer, and covers the sidewall of a low portion of a respective one of the plurality of second semiconductor pillars, and is electrically connected to a respective one of the plurality of transistors;
   a plurality of dielectric layers, wherein each of the plurality of dielectric layers covers at least a sidewall of a respective one of the plurality of first electrodes, a sidewall of a respective one of the plurality of first support pillars, and a sidewall of a lower portion of a respective one of the plurality of second support pillars; and
   a plurality of second electrodes arranged in gaps between the plurality of first semiconductor pillars and in gaps between the plurality of second semiconductor pillars, wherein each of the plurality of second electrodes covers a respective one of the plurality of dielectric layers.

4. The semiconductor structure according to claim 3, further comprising:
   a plurality of oxidation pillars, wherein each of the plurality of first semiconductor pillars is arranged on a top surface of a respective one of the plurality of oxidation pillars; and
   a sacrificial layer arranged in gaps between the plurality of oxidation pillars,
   wherein the plurality of dielectric layers also cover a top surface of the sacrificial layer.

5. A memory device, comprising at least one semiconductor structure, wherein the at least one semiconductor structure comprises: a plurality of first semiconductor pillars, a plurality of second semiconductor pillars, a first support layer, a storage structure, and a plurality of transistors,
   wherein the plurality of first semiconductor pillars are arranged in an array in a first direction and in a second direction, each of the first direction and the second direction is perpendicular to an extending direction of each of the plurality of first semiconductor pillars, and the first direction intersects with the second direction;
   wherein the first support layer covers sidewalls of top portions of the plurality of first semiconductor pillars;
   wherein each of the plurality of second semiconductor pillars is arranged on and in contact with a respective one of the plurality of first semiconductor pillars, and the storage structure is arranged around sidewalls of the plurality of first semiconductor pillars and sidewalls of lower portions of the plurality of second semiconductor pillars; and
   wherein a channel structure of each of the plurality of transistors is arranged in an upper portion of a respective one of the plurality of second semiconductor pillars, and an extending direction of the channel structure is perpendicular to a plane where the first direction and the second direction are located,
   wherein each of the plurality of transistors comprises:
   a gate structure arranged around a portion of a sidewall of the upper portion of the respective of the plurality of second semiconductor pillars;
   a source arranged in the upper portion of the respective one of the plurality of second semiconductor pillars and arranged at one end of the channel structure; and
   a drain arranged in the upper portion of the respective one of the plurality of second semiconductor pillars and arranged at another end of the channel structure.

6. A method for manufacturing a semiconductor structure, comprising:
   providing a first semiconductor base, and forming a first active layer on the first semiconductor base, wherein the first active layer comprises a plurality of first semiconductor pillars arranged in an array in a first direction and in a second direction, each of the first direction and the second direction is perpendicular to an extending direction of each of the plurality of first semiconductor pillars, and the first direction intersects with the second direction;
   forming a first support layer on a top portion of the first active layer;
   forming a second semiconductor base on the first active layer and the first support layer;

removing a portion of the second semiconductor base to form a second active layer, wherein the second active layer comprises a plurality of second semiconductor pillars, and each of the plurality of second semiconductor pillars is arranged on and in contact with a top surface of a respective one of the plurality of first semiconductor pillars;

forming a second support layer on a top portion of the second active layer;

forming a storage structure on sidewalls of the plurality of first semiconductor pillars and on sidewalls of lower portions of the plurality of second semiconductor pillars; and forming a gate structure on at least one side of a portion of a sidewall of an upper portion of each of the plurality of second semiconductor pillars.

7. The method for manufacturing the semiconductor structure according to claim 6, wherein before forming the first support layer, the method further comprises: forming a first insulation layer in gaps between the plurality of first semiconductor pillars, wherein forming the first support layer comprises:

removing a portion of the first insulation layer to form a plurality of first grooves;

forming a first support pillar in each of the plurality of first grooves;

removing a portion of the first insulation layer to form a plurality of second grooves; and forming a second support pillar in each of the plurality of second grooves, wherein a plurality of first support pillars and a plurality of second support pillars collectively form the first support layer, each of the plurality of first support pillars is arranged between top portions of two first semiconductor pillars adjacent to each other in the second direction, each of the plurality of second support pillars is arranged between top portions of two first semiconductor pillars adjacent to each other in the first direction, and the first support layer covers a portion of the sidewall of the top portion of each of the plurality of first semiconductor pillars.

8. The method for manufacturing the semiconductor structure according to claim 7, wherein forming the second semiconductor base comprises:

removing a portion of the first support layer and a portion of the first insulation layer to expose the portion of the sidewall of the top portion of each of the plurality of first semiconductor pillars; and forming the second semiconductor base on the plurality of first semiconductor pillars through an epitaxial growth process.

9. The method for manufacturing the semiconductor structure according to claim 7, wherein before forming the second support layer, the method further comprises: forming a second insulation layer in gaps between the plurality of second semiconductor pillars, wherein forming the second support layer comprises:

removing a portion of the second insulation layer to form a plurality of third grooves;

forming a third support pillar in each of the plurality of third grooves;

removing a portion of the second insulation layer to form a plurality of fourth grooves; and forming a fourth support pillar in each of the plurality of fourth grooves, wherein a plurality of third support pillars and a plurality of fourth support pillars collectively form the second support layer, each of the plurality of third support pillars is arranged between top portions of two second semiconductor pillars adjacent to each other in the second direction, each of the plurality of fourth support pillars is arranged between top portions of two second semiconductor pillars adjacent to each other in the first direction, and the second support layer covers a portion of the sidewall of the top portion of each of the plurality of second semiconductor pillars.

10. The method for manufacturing the semiconductor structure according to claim 9, wherein forming the storage structure comprises:

completely removing a remaining portion of the first insulation layer and a remaining portion of the second insulation layer;

oxidizing exposed surfaces of the plurality of first semiconductor pillars and exposed surfaces of the plurality of second semiconductor pillars to form a first oxide layer;

forming a sacrificial material in gaps of the first oxide layer;

removing the second support layer and the first oxide layer to form a plurality of first filling areas, wherein each of the plurality of first semiconductor pillars is surrounded by a respective one of the plurality of first filling areas, and each of the plurality of second semiconductor pillars is surrounded by a respective one of the plurality of first filling areas;

filling the plurality of first filling areas with a conductive material to form a plurality of first electrodes;

removing the sacrificial material between the plurality of first electrodes to form a plurality of second filling areas; and sequentially forming a dielectric layer and a second electrode in each of the plurality of second filling areas.

11. The method for manufacturing the semiconductor structure according to claim 10, wherein before removing the second support layer, the method further comprises:

removing the first oxide layer arranged on the sidewalls of the top portions of the plurality of second semiconductor pillars to form a third filling area, and forming the sacrificial material in the third filling area to form a third support layer on the top portions of the plurality of second semiconductor pillars.

12. The method for manufacturing the semiconductor structure according to claim 10, wherein while forming the plurality of first electrodes, the method further comprises: forming the conductive material in the plurality of third grooves and in the plurality of fourth grooves to form a fourth support layer on the top portions of the plurality of second semiconductor pillars.

13. The method for manufacturing the semiconductor structure according to claim 10, wherein forming the first active layer comprises:

forming, in the first semiconductor base, a plurality of first trenches spaced apart from each other in the first direction and a plurality of second trenches spaced apart from each other in the second direction, wherein the first semiconductor base is divided into the plurality of first semiconductor pillars by the plurality of first trenches and the plurality of second trenches; and expanding at least one of a bottom portion of each of the plurality of first trenches or a bottom portion of each of the plurality of second trenches to allow each of the plurality of formed first semiconductor pillars to comprise a first portion and a second portion arranged on the first portion, wherein a maximum diameter width of the first portion is less than a minimum diameter width of the second portion.

14. The method for manufacturing the semiconductor structure according to claim 13, wherein while the first oxide layer is formed, a plurality of first portions are completely oxidized into a plurality of oxidation pillars; while the sacrificial material is formed in the gaps of the first oxide layer, the sacrificial material is further formed in gaps between the plurality of oxidation pillars; and when the sacrificial material between the plurality of first electrodes is removed, the sacrificial material between the plurality of oxidation pillars is remained to form a sacrificial layer, and the plurality of oxidation pillars and the sacrificial layer form a bottom support layer.

15. The method for manufacturing the semiconductor structure according to claim 12, further comprising:
- removing the fourth support layer and a portion of the storage structure arranged on upper portions of the plurality of second semiconductor pillars to expose sidewalls of the upper portions of the plurality of second semiconductor pillars; and
- forming the gate structure on at least one side of a portion of the sidewall of the upper portion of each of the plurality of second semiconductor pillars.

* * * * *